United States Patent
Chabries et al.

(10) Patent No.: US 8,085,959 B2
(45) Date of Patent: *Dec. 27, 2011

(54) HEARING COMPENSATION SYSTEM INCORPORATING SIGNAL PROCESSING TECHNIQUES

(75) Inventors: Douglas Melvin Chabries, Orem, UT (US); Richard Wesley Christiansen, Highland, UT (US)

(73) Assignee: Brigham Young University, Provo, UT (US)

( * ) Notice: Subject to any disclaimer, the term of this patent is extended or adjusted under 35 U.S.C. 154(b) by 1313 days.

This patent is subject to a terminal disclaimer.

(21) Appl. No.: 10/937,104

(22) Filed: Sep. 8, 2004

(65) Prior Publication Data

US 2005/0111683 A1    May 26, 2005

Related U.S. Application Data

(63) Continuation-in-part of application No. 09/444,972, filed on Nov. 22, 1999, now Pat. No. 6,885,752, which is a continuation-in-part of application No. 09/169,547, filed on Sep. 9, 1998, now abandoned, which is a continuation of application No. 08/697,412, filed on Aug. 22, 1996, now Pat. No. 6,072,885, which is a continuation of application No. 08/585,481, filed on Jan. 16, 1996, now Pat. No. 5,848,171, which is a continuation of application No. 08/272,927, filed on Jul. 8, 1994, now Pat. No. 5,500,902.

(51) Int. Cl.
*H04R 25/00*    (2006.01)
(52) U.S. Cl. .......................... 381/312; 381/317; 381/321
(58) Field of Classification Search .................. 381/23.1, 381/94.1, 94.3, 98, 99, 102, 106, 312, 320, 381/321, 317; 455/232.1, 234.1, 247.1, 251.1, 455/303, 306
See application file for complete search history.

(56) References Cited

U.S. PATENT DOCUMENTS 3,495,244 A    2/1970    La Rosa
(Continued)

FOREIGN PATENT DOCUMENTS

DE    26 28 626    1/1977
(Continued)

OTHER PUBLICATIONS

Buus et al., "Psychometric Functions for Level Discrimination", J. Acoustic Soc. Am., 90 (3), Sep. 1991, pp. 1371-1380.
(Continued)

*Primary Examiner* — Huyen D Le
(74) *Attorney, Agent, or Firm* — Holland & Hart

(57) ABSTRACT

A hearing compensation system comprises a plurality of bandpass filters having an input connected to an input transducer and each bandpass filter having an output connected to the input of one of a plurality of multiplicative automatic gain control (MAGC) circuits whose outputs are summed together and connected to the input of an output transducer. The MAGC circuits attenuate acoustic signals having a constant background level without the loss of speech intelligibility. The identification of the background noise portion of the acoustic signal is made by the constancy of the envelope of the input signal in each of the several frequency bands. The background noise that will be suppressed includes multi-talker speech babble, fan noise, feedback whistle, florescent light hum, and white noise. For use in the consumer electronics field background acoustic noise may be sensed and used to adjust gain in the various MAGC circuits so as to improve a user's listening experience, whether the user is hearing impaired or not.

68 Claims, 19 Drawing Sheets

U.S. PATENT DOCUMENTS

| | | | |
|---|---|---|---|
| 3,518,578 A | 6/1970 | Oppenheim et al. |
| 3,571,529 A | 3/1971 | Gharib et al. |
| 3,784,750 A | 1/1974 | Stearns et al. |
| 3,920,931 A | 11/1975 | Yanick, Jr. |
| 3,927,279 A | 12/1975 | Nakamura et al. |
| 3,928,733 A | 12/1975 | Hueber |
| 3,989,904 A | 11/1976 | Rohrer et al. |
| 4,025,721 A | 5/1977 | Graupe et al. |
| 4,025,723 A | 5/1977 | Blackledge |
| 4,051,331 A | 9/1977 | Strong et al. |
| 4,052,571 A | 10/1977 | Gregory et al. |
| 4,052,572 A | 10/1977 | Schafer |
| 4,061,875 A | 12/1977 | Freifeld et al. |
| 4,099,035 A | 7/1978 | Yanick |
| 4,118,604 A | 10/1978 | Yanick |
| 4,135,590 A | 1/1979 | Gaulder |
| 4,142,072 A | 2/1979 | Berland |
| 4,156,116 A | 5/1979 | Yanick |
| 4,185,168 A | 1/1980 | Graupe et al. |
| 4,187,413 A | 2/1980 | Moser |
| 4,188,667 A | 2/1980 | Graupe et al. |
| 4,204,172 A | 5/1980 | Ben Sadou et al. |
| 4,232,192 A | 11/1980 | Beex |
| 4,238,746 A | 12/1980 | McCool et al. |
| 4,243,935 A | 1/1981 | McCool et al. |
| 4,354,064 A | 10/1982 | Scott |
| 4,354,065 A | 10/1982 | Buettner |
| 4,355,368 A | 10/1982 | Zeidler et al. |
| 4,366,349 A | 12/1982 | Adelman |
| 4,388,494 A | 6/1983 | Schone et al. |
| 4,393,275 A | 7/1983 | Feldman et al. |
| 4,396,806 A | 8/1983 | Anderson |
| 4,405,831 A | 9/1983 | Michelson |
| 4,405,832 A | 9/1983 | Sondermeyer |
| 4,409,435 A | 10/1983 | Ono |
| 4,419,544 A | 12/1983 | Adelman |
| 4,425,481 A | 1/1984 | Mansgold et al. |
| 4,430,754 A | 2/1984 | Ishigaki |
| 4,441,202 A | 4/1984 | Tong et al. |
| 4,471,171 A | 9/1984 | Kopke et al. |
| 4,475,230 A | 10/1984 | Fukuyama et al. |
| 4,490,585 A | 12/1984 | Tanaka |
| 4,508,940 A | 4/1985 | Steeger |
| 4,509,022 A | 4/1985 | Ridel |
| 4,517,415 A | 5/1985 | Laurence |
| 4,545,082 A | 10/1985 | Hood |
| 4,548,082 A | 10/1985 | Engebretson et al. |
| 4,589,133 A | 5/1986 | Swinbanks |
| 4,589,137 A | 5/1986 | Miller |
| 4,596,902 A | 6/1986 | Gilman |
| 4,602,337 A | 7/1986 | Cox |
| 4,622,440 A | 11/1986 | Slavin |
| 4,628,529 A | 12/1986 | Borth et al. |
| 4,629,834 A | 12/1986 | Waggoner et al. |
| 4,630,302 A * | 12/1986 | Kryter .......................... 381/94.3 |
| 4,658,426 A | 4/1987 | Chabries et al. |
| 4,696,032 A | 9/1987 | Levy |
| 4,712,244 A | 12/1987 | Zwicker et al. |
| 4,723,294 A | 2/1988 | Taguchi |
| 4,731,850 A | 3/1988 | Levitt et al. |
| 4,750,207 A | 6/1988 | Gebert et al. |
| 4,759,071 A | 7/1988 | Heide |
| 4,768,165 A | 8/1988 | Hohn |
| 4,773,095 A | 9/1988 | Zwicker et al. |
| 4,783,818 A | 11/1988 | Graupe et al. |
| 4,790,018 A | 12/1988 | Preves et al. |
| 4,791,672 A | 12/1988 | Nunley et al. |
| 4,792,977 A | 12/1988 | Anderson et al. |
| 4,802,227 A | 1/1989 | Elko et al. |
| 4,827,524 A | 5/1989 | Rising |
| 4,829,270 A | 5/1989 | Anderson et al. |
| 4,837,832 A | 6/1989 | Fanshel |
| 4,852,175 A | 7/1989 | Kates |
| 4,852,177 A | 7/1989 | Ambrose |
| 4,870,688 A | 9/1989 | Voroba et al. |
| 4,879,749 A | 11/1989 | Levitt et al. |
| 4,882,761 A | 11/1989 | Waldhauer |
| 4,882,762 A | 11/1989 | Waldhauer |
| 4,887,299 A | 12/1989 | Cummins et al. |
| 4,912,767 A | 3/1990 | Chang |
| 4,926,488 A | 5/1990 | Nadas et al. |
| 4,939,685 A | 7/1990 | Feintuch |
| 4,947,433 A | 8/1990 | Gebert |
| 4,953,216 A | 8/1990 | Beer |
| 4,956,867 A | 9/1990 | Zurek et al. |
| 4,961,230 A | 10/1990 | Rising |
| 4,972,487 A | 11/1990 | Mangold et al. |
| 4,982,317 A | 1/1991 | Mauthe |
| 4,988,333 A | 1/1991 | Engebretson et al. |
| 4,989,251 A | 1/1991 | Mangold |
| 4,992,966 A | 2/1991 | Widin et al. |
| 5,014,318 A | 5/1991 | Schott et al. |
| 5,016,280 A | 5/1991 | Engebretson et al. |
| 5,024,224 A | 6/1991 | Engebretson et al. |
| 5,027,410 A | 6/1991 | Williamson et al. |
| 5,029,217 A | 7/1991 | Chabries et al. |
| 5,033,090 A | 7/1991 | Weinrich |
| 5,046,102 A | 9/1991 | Zwicker et al. |
| 5,046,103 A | 9/1991 | Warnaka et al. |
| 5,083,312 A | 1/1992 | Newton et al. |
| 5,091,952 A | 2/1992 | Williamson et al. |
| 5,097,510 A | 3/1992 | Graupe |
| 5,111,419 A | 5/1992 | Morley, Jr. et al. |
| 5,144,674 A | 9/1992 | Meyer et al. |
| 5,170,434 A | 12/1992 | Anderson |
| 5,189,704 A | 2/1993 | Krauss |
| 5,201,006 A | 4/1993 | Weinrich |
| 5,214,709 A | 5/1993 | Ribic |
| 5,225,836 A | 7/1993 | Morley, Jr. et al. |
| 5,233,665 A | 8/1993 | Vaughn et al. |
| 5,259,033 A | 11/1993 | Goodings et al. |
| 5,263,019 A | 11/1993 | Chu .............................. 370/32.1 |
| 5,274,711 A | 12/1993 | Rutledge et al. |
| 5,276,739 A | 1/1994 | Krokstad et al. |
| 5,278,912 A | 1/1994 | Waldhauer |
| 5,285,502 A | 2/1994 | Walton et al. |
| 5,289,544 A | 2/1994 | Franklin |
| 5,291,525 A | 3/1994 | Funderburk et al. |
| 5,305,307 A | 4/1994 | Chu .............................. 370/32.1 |
| 5,355,418 A | 10/1994 | Kelsey et al. |
| 5,378,933 A | 1/1995 | Pfannenmueller et al. |
| 5,396,560 A | 3/1995 | Arcos et al. |
| 5,402,496 A | 3/1995 | Soli et al. |
| 5,412,735 A | 5/1995 | Engebretson et al. |
| 5,473,684 A | 12/1995 | Bartlett et al. |
| 5,475,759 A | 12/1995 | Engebretson |
| 5,500,902 A | 3/1996 | Stockham, Jr. et al. |
| 5,550,923 A | 8/1996 | Hotvet |
| 5,651,071 A | 7/1997 | Lindemann et al. |
| 5,677,987 A | 10/1997 | Seki et al. .................... 395/2.35 |
| 5,680,467 A | 10/1997 | Hansen ........................ 381/68.2 |
| 5,687,242 A | 11/1997 | Iburg |
| 5,689,572 A | 11/1997 | Ohki et al. .................... 381/71.3 |
| 5,710,819 A | 1/1998 | Topholm et al. |
| 5,710,820 A | 1/1998 | Martin et al. |
| 5,721,783 A | 2/1998 | Anderson |
| 5,825,898 A | 10/1998 | Marash |
| 5,848,171 A | 12/1998 | Stockham, Jr. et al. |
| 5,867,581 A | 2/1999 | Obara |
| 6,023,517 A | 2/2000 | Ishige |
| 6,044,162 A | 3/2000 | Mead et al. |
| 6,072,885 A | 6/2000 | Stockham, Jr. et al. |
| 6,163,287 A | 12/2000 | Huang |
| 6,757,395 B1 * | 6/2004 | Fang et al. .................... 381/94.3 |

FOREIGN PATENT DOCUMENTS

| | | |
|---|---|---|
| EP | 0 064 042 | 1/1986 |
| EP | 0 341 903 | 11/1989 |
| EP | 0 415 677 | 3/1991 |
| EP | 0 581 261 | 2/1994 |
| EP | 0 581 262 | 2/1994 |
| EP | 0 714 067 | 5/1996 |
| WO | 97/50186 | 12/1997 |
| WO | 98/28943 | 7/1998 |
| WO | 98/47227 | 10/1998 |
| WO | 99/26453 | 5/1999 |

OTHER PUBLICATIONS

Boll, S., "Suppression of Acoustic Noise in Speech Using Spectral Subtraction," Apr. 1979, IEEE Trans. on ASSP, vol. ASSP-27, pp. 113-120.

Brey, Robert H. et al., "Improvement in Speech Intelligibillity in Noise Employing an Adaptive Filter with Normal and Hearing-Impaired Subjects," Journal of Rehabilitation Research and Development, vol. 24, No. 4, pp. 75-86.

Bustamante, et al. "Measurement and Adaptive Suppression of Acoustic Feedback in Hearing Aids", Proc. 1989 IEEE ICASSP, pp. 2017-2020, 1989.

Carney, L.H., "A Model for the Responses of Low-Frequency Auditory-Nerve Fibers in Cat", J. Accout. Soc. Am., 93 (1), Jan. 1993, pp. 401-417.

Chabries, Douglas M. et al., "Application of Adaptive Digital Signal Processing to Speech Enhancement for the Hearing Impaired", Journal of Rehabilitation Research and Development, vol. 24, No. 4, pp. 65-74.

Chabries, et al., "Application of a Human Auditory Model to Loudness Perception and Hearing Compensation", Proc. IEEE ICASSP '95, vol. 5, pp. 3527-3530, 1995.

Chabries et al., "Noise Reduction by Amplitude Warping in the Spectral Domain in a Model-Based Algorithm", Jun. 11, 1997, pp. 1-11.

Crozier, P. M., et al., "Speech Enhancement Employing Spectral Subtraction and Linear Predictive Analysis," 1993, Electronics Letters, 29(12): 1094-1095.

Drake et al., Wavelet Analysis in Recruitment of Loudness Compensation, IEEE Transactions on Signal Processing, vol. 41, No. 12, Dec. 1993, pp. 3306-3311.

"Delta-Sigma Overview", Fall 1996, ECE 627, 29 pages.

Estermann, Pius et al., "Feedback Cancellation in Hearing Aids: Results from Using Frequency-Domain Adaptive Filters", Proc. IEEE ISCAS, pp. 257-260, Jun. 1994.

Etter et al., "Noise Reduction by Noise-Adaptive Spectral Magnitude Expansion", May 1994, J. Audio Eng. Soc., vol. 42, No. 5, pp. 341-348.

Geisler et al., "Effects of a Compressive Nonlinearity in a Cochlear Model", J. Accoust. Soc. Am., vol. 78, No. 1, Jul. 1985, pp. 257-260.

Gaupe, "Applications of Estimation and Identification Theory to Hearing Aids", Auditory and Prosthetic Research, 1979, pp. 169-181.

Hellman et al., "Intensity Discrimination as the Driving Force for Loudness. Application to Pure Tones in Quite", J. Accoust Soc. Am. 87 (3), Mar. 1990, pp. 1255-1265.

Kaelin et al., "A digital frequency-domain implementation of a very high gain hearing aid with compensation for recruitment of loudness and acoustic echo cancellation", 1998, Signal Processing 64, pp. 71-85.

Karema, et al., "An Oversampled Sigma-Delta A/D Converter Circuit Using Two-Stage Fourth Order Modulator", 1990, IEEE, International Symposium on Circuits and Systems, vol. 4., pp. 3279-3282.

Kates, James M., "Feedback Cancellation in Hearing Aids: Results from a Computer Simulation", 1991, IEEE, Transactions on Signal Processing, vol. 39, No. 3, pp. 553-562.

Killion, Mead C., The K-Amp Hearing Aid: An Attempt to Present High Fidelity for Persons with Impaired Hearing:, Jul. 1993, American Journal of Audiology, vol. 2, No. 2, pp. 52-74.

Killion, Mead, "The SIN Report: Circuits Haven't Solved the Hearing-in-Noise Problem," Oct. 1997, The Hearing Journal, vol. 50, No. 10, pp. 28-34.

Kuo, et al., "Integrated Frequency-Domain Digital Hearing Aid with the Lapped Transform", IEE Electronics Letters, vol. 28, No. 23, pp. 2117-2118, Nov. 1992.

Lyon, R.F. et al., "An Analog Electronic Cochlea", IEEE Transactions on Acoustics, Speech, and Signal Processing, vol. 36, No. 7, Jul. 1988, pp. 1119-1134.

Maxwell, et al., "Reducing Acoustic Feedback in Hearing Aids", 1995, IEEE Transactions on Speech and Audio Processing, vol. 3, No. 4, pp. 304-313.

Neely et al., "A Model for Active Elements in Cochlear Biomechanics", J. Acoust. Soc. Am. 79 (5), May 1986, pp. 1472-1480.

Norsworthy, Steven R. et al., "Delta-Sigma Data Converters. Theory, Design, and Simulation", New York, IEEE Press, 1997., pp. 321-324.

Oppenheim et al., "Nonlinear Filtering of Multiplied and Convolved Signals", Reprinted from the Proceedings of the IEEE, vol. 56, Aug. 1968, pp. 1264-1291.

Paul, J.E. "Adaptive Digital Techniques for Audio Noise Cancellation" Proceedings of the 1978 IEEE Int'l. Symposium on Circuits and Systems, N.Y. , May 17-19, 1978, pp. 232-236.

Plomp, R., "The Negative Effect of Amplitude Compression in Hearing Aids in the Light of the Modulation-Transfer Function," Jun. 1988, Journal of the Acoustical Society of America, vol. 83, No. 6, pp. 2322-2327.

Plomp, Reiner, "Noise, Amplification, and Compression: Considerations of Three Main Issues in Hearing Aid Design", Ear & Hearing, Feb. 1994, pp. 2-12.

Quatieri, et al., "Noise Reduction Based on Spectral Change", IEEE ASSP Workshop on Applications of Signal Processing to Audio and Acoustics (82), pp. 1-4.

Riley, et al., "High-Decimation Digital Filters", 1991 IEEE Acoustics Speech and Signal Processing Proceedings., pp. 1613-1616.

Sachs et al., "A Computational Model for Rate-Level Functions from Cat Auditory-Nerve Fibers", Hearing Research, 41 (1989), pp. 61-69.

Siegel, Lee, "Sound Sans Distortion", The Salt Lake Tribune, Science & Medicine, Nov. 4, 1993, pp. B1,B3.

Sedra, A.S. et al., "Microelectronic Circuits", New York : Oxford Univ. Press, c1991., pp. 60-67, 230-241, 900-902.

Sheikhzadeh, H. et al., "Comparative Performance of Spectral Subtraction and HMM-Based Speech Enhancement Strategies with Application to Hearing Aid Design," 1994, Proc. IEEE, ICASSP, pp. I-13 to I-16.

Siqueira et al., "Subband Adaptive Filtering Applied to Acoustic Feedback Reduction in Hearing Aids", 1997 IEEE, pp. 788-792.

Stein et al., "Listener-Assessed Intelligibility of a Hearing Aid Self-Adaptive Noise Filter", Ear & Hearing, vol. 5, No. 4, 1984, pp. 199-204.

Stockham Thomas G., Jr., "The Application of Generalized Linearity to Automatic Gain Control", IEEE Transactions on Audio and Electroacoustics, 16 (2), pp. 267-270, Jun. 1968.

Teder, Harry, "Hearing Instrument in Noise and the Syllabic Speech-to-Noise Ratio," 1991, Hearing Instruments, vol. 42, No. 2.

Weis et al., "A Model for Signal Transmission in an Ear Having Hair Cells with Free-Standing Stereocillia. I.V. Mechanoelectric Transduction Stage", Hearing Research 20 (1985), pp. 175-195.

Wyrsch et al., "Adaptive Feedback Cancelling in Subbands for Hearing Aids", Proc. IEEE ICASSP, vol. 2, pp. 921-924, Mar. 1999.

Yost, William A., "Fundamentals of Hearing, An Introduction," 1994, Academic Press, Third Edition, pp. 56-57.

* cited by examiner

HEARING COMPENSATION SYSTEM INCORPORATING SIGNAL PROCESSING TECHNIQUES

RELATED APPLICATIONS

This application is a continuation-in-part of U.S. patent application Ser. No. 09/444,972, filed Nov. 22, 1999 now U.S. Pat. No. 6,885,752, which is, in turn, a continuation-in-part of U.S. patent application Ser. No. 09/169,547, filed Sep. 9, 1998 (now abandoned) which is, in turn, a continuation-in-part of U.S. patent application Ser. No. 08/697,412, filed Aug. 22, 1996 (now U.S. Pat. No. 6,072,885) which is, in turn, a continuation-in-part of U.S. patent application Ser. No. 08/585,481, filed Jan. 16, 1996 (now U.S. Pat. No. 5,848,171) which is, in turn, a continuation of U.S. patent application Ser. No. 08/272,927, filed Jul. 8, 1994 (now U.S. Pat. No. 5,500,902).

BACKGROUND OF THE INVENTION

The present invention relates to electronic hearing devices and electronic systems for sound reproduction. More particularly, the present invention relates to noise suppression to preserve the fidelity of signals in electronic hearing aid devices and electronic sound systems. According to the present invention, the noise suppression devices and methods utilize both analog and digital signal processing techniques.

One of the most common complaints made by hearing aid users is the inability to hear in the presence of noise. Accordingly, the suppression of noise has long been the focus of researchers, and many approaches to solving the noise suppression problem have been proposed. In one approach, an independent measure of the noise is made and then subtracted from the signal being processed. This technique is typically applied to signals that are expressed as follows:

$$s(t)=d(t)+n(t)$$

Where s(t) is the signal being processed, d(t) is the desired portion of the signal s(t), and n(t) the noise in the signal s(t).

For example, one or more sensors may be employed along with adaptive techniques to form an independent measure of the estimate of the noise, $n_e(t)$ from interference. By subtracting the noise estimate, $n_e(t)$, from the signal, s(t), an improved version of the desired signal, d(t), is obtained. To emphasize the subtraction of the noise estimate, $n_e(t)$, this technique is commonly referred to as "noise canceling." This noise canceling technique has been applied to both sonar systems and medical fetal electrocardiograms, and has further been found to be effective to process acoustic signals containing both speech and interference. See, for example, Douglas M. Chabries, et al., *Application of Adaptive Digital Signal Processing to Speech Enhancement for the Hearing Impaired*, Journal of Rehabilitation Research and Development, Vol. 24, No. 4, pp. 65-74, (1987) and Robert H. Brey, et al., *Improvement in Speech Intelligibility in Noise Employing an Adaptive Filter with Normal and Hearing-Impaired Subjects*, Journal of Rehabilitation Research and Development, Vol., 24, No. 4, pp. 75-86 (1987).

When no independent sample or estimate of the noise is available, other techniques to provide noise suppression have been employed. In several instances, researchers have exploited the differences in the temporal properties of speech and noise to enhance the intelligibility of sound. These techniques are typically referred to as noise suppression or speech enhancement. See, for example, U.S. Pat. No. 4,025,721 to Graupe, U.S. Pat. No. 4,185,168 to Graupe, and S. Boll, *Suppression of Acoustic Noise in Speech Using Spectral Subtraction*, IEEE Trans. on ASSP, Vol. ASSP-27, pp. 113-120 (April, 1979), H. Sheikhzadeh, et al., *Comparative Performance of Spectral Subtraction and HMM-Based Speech Enhancement Strategies with Application to Hearing Aid Design*, Proc. IEEE ICASSP, pp. I-13 to I-17 (1994), and P. M Crozier, BMG Cheethan, C. Holt, and E. Munday, *Speech enhancement employing spectral subtraction and linear predictive analysis*, Electronic Letters, vol. 24, No. 12, pp. 1094-1095 (1993).

These approaches have been shown to enhance particular signals in comparison to other signals that have been defined as noise. One researcher, Mead Killion, has noted that none of these approaches has enhanced speech intelligibility. See Mead Killion, *Etymotic Update*, Number 15, (Spring, 1997). However, in low noise environments, compression techniques have been shown to relieve hearing deficits. See Mead Killion, *The SIN report: Circuits haven't solved the hearing-in-noise problem*, The Hearing Journal, Vol. 50, No. 20, pp 28-34 (October, 1997).

With these techniques, researchers have generally noted a decrease in speech intelligibility testing when noise contaminated speech is processed, despite the fact that measures of quality or preference increase. Typically, the specification of the noise characteristics or the definition of the speech parameters distinguishes the various techniques in the second category of noise suppression from one another. It has been demonstrated that acoustic signals can be successfully processed according to these techniques to enhance voiced or vowel sounds in the presence of white or impulsive noise, however, these techniques are less successful in preserving unvoiced sounds such as fricatives or plosives.

Other noise suppression techniques have been developed wherein speech is detected and various proposed methods are employed to either turn off the amplifier in a hearing aid when speech is not present or to clip speech and then turn off the output amplifier in the absence of detectable speech. See for example, Harry Teder, *Hearing Instruments in Noise and the Syllabic Speech-to-Noise Ratio*, Hearing Instruments, Vol. 42, No. 2 (1991). Further examples of the approach to noise suppression by suppressing noise to enhance the intelligibility of sound are found in U.S. Pat. No. 4,025,721 to Graupe; U.S. Pat. No. 4,405,831 to Michaelson; U.S. Pat. No. 4,185, 168 to Graupe et al.; U.S. Pat. No. 4,188,667 to Graupe et al.; U.S. Pat. No. 4,025,721 to Graupe et al.; U.S. Pat. No. 4,135, 590 to Gaulder; and U.S. Pat. No. 4,759,071 to Heide et al.

Other approaches have focused upon feedback suppression and equalization (U.S. Pat. No. 4,602,337 to Cox, and U.S. Pat. No. 5,016,280 to Engebretson, and see also Leland C. Best, *Digital Suppression of Acoustic Feedback in Hearing Aids*, Thesis, University of Wyoming, May 1995 and Rupert L. Goodings, Gideon A. Senensieb, Phillip H. Wilson, Roy S. Hansen, *Hearing Aid Having Compensation for Acoustic Feedback*, U.S. Pat. No. 5,259,033 (issued Nov. 2, 1993), dual microphone configurations (U.S. Pat. No. 4,622,440 to Slavin and U.S. Pat. No. 3,927,279 to Nakamura et al.), or upon coupling to the ear in unusual ways (e.g., RF links, electrical stimulation, etc.) to improve intelligibility. Examples of these approaches are found in U.S. Pat. No. 4,545,082 to Engebretson, U.S. Pat. No. 4,052,572 to Shafer, U.S. Pat. No. 4,852, 177 to Ambrose, and U.S. Pat. No. 4,731,850 to Levitt.

Still other approaches have opted for digital programming control implementations which will accommodate a multitude of compression and filtering schemes. Examples of such approaches are found in U.S. Pat. No. 4,471,171 to Kopke et al. and U.S. Pat. No. 5,027,410 to Williamson. Some approaches, such as that disclosed in U.S. Pat. No. 5,083,312 to Newton, utilize hearing aid structures which allow flexibility by accepting control signals received remotely by the aid.

U.S. Pat. No. 4,187,413 to Moser discloses an approach for a digital hearing aid which uses an analog-to-digital converter and a digital-to-analog converter, and implements a fixed transfer function H(z). However, a review of neuro-psychological models in the literature and numerous measurements resulting in Steven's and Fechner's laws (see S. S. Stevens, *Psychophysics*, Wiley 1975; G. T. Fechner, *Elemente der Psychophysik*, Breitkopf u. Härtel, Leipzig, 1960) conclusively reveals that the response of the ear to input sound is nonlinear. Hence, no fixed linear transfer function H(z) exists which will fully compensate for hearing.

U.S. Pat. No. 4,425,481 to Mansgold, et al. discloses a programmable digital signal processor (DSP)-based device with features similar or identical to those commercially available, but with added digital control in the implementation of a three-band (lowpass, bandpass, and highpass) hearing aid. The outputs of the three frequency bands are each subjected to a digitally controlled variable attenuator, a limiter, and a final stage of digitally controlled attenuation before being summed to provide an output. Control of attenuation is apparently accomplished by switching in response to different acoustic environments.

U.S. Pat. Nos. 4,366,349 and 4,419,544 to Adelman describe and trace the processing of the human auditory system, but do not reflect an understanding of the role of the outer hair cells within the ear as a muscle to amplify the incoming sound and provide increased basilar membrane displacement. These references assume that hearing deterioration makes it desirable to shift the frequencies and amplitude of the input stimulus, thereby transferring the location of the auditory response from a degraded portion of the ear to another area within the ear (on the basilar membrane) which has adequate response.

Mead C. Killion, *The k-amp hearing aid: an attempt to present high fidelity for persons with impaired hearing*, American Journal of Audiology, vol. 2, No. 2, pp. 52-74 (July, 1993), states that based upon the results of subjective listening tests for acoustic data processed with both linear gain and compression, either approach performs equally well. It is argued that the important factor in restoring hearing for individuals with hearing losses is to provide the appropriate gain. In the absence of a mathematically modeled analysis of that gain, several compression techniques have been proposed, e.g., U.S. Pat. No. 4,887,299 to Cummins; U.S. Pat. No. 3,920,931 to Yanick, Jr.; U.S. Pat. No. 4,118,604 to Yanick, Jr.; U.S. Pat. No. 4,052,571 to Gregory; U.S. Pat. No. 4,099,035 to Yanick, Jr. and U.S. Pat. No. 5,278,912 to Waldhauer. Some involve a linear fixed high gain at soft input sound levels and switch to a lower gain at moderate or loud sound levels. Others propose a linear gain at soft sound intensities, a changing gain or compression at moderate intensities and a reduced, fixed linear gain at high or loud intensities. Still others propose table look-up systems with no details specified concerning formation of look-up tables, and others allow programmable gain without specification as to the operating parameters.

Switching between the gain mechanisms in each of these sound intensity regions has introduced significant distracting artifacts and distortion in the sound. Further, these gain-switched schemes have been applied typically in hearing aids to sound that is processed in two or three frequency bands, or in a single frequency band with pre-emphasis filtering.

Insight into the difficulty with prior art gain-switched schemes may be obtained by examining the human auditory system. For each frequency band where hearing has deviated from the normal threshold, a different sound compression is required to provide normal hearing sensation. Therefore, the application of gain schemes which attempt to use a frequency band wider than a single critical band (i.e., critical band as defined in *Fundamentals of Hearing, An Introduction*, Third Edition, William A. Yost, Academic Press, page 307 (1994), cannot produce the optimum hearing sensation in the listener. If, for example, it is desired to use a frequency bandwidth which is wider than the bandwidth of the corresponding critical bandwidth, then some conditions must be met in order for the wider bandwidth to optimally compensate for the hearing loss. These conditions are that the wider bandwidth must exhibit the same normal hearing threshold and dynamic range and require the same corrective hearing gain as the critical bands contained within the wider bandwidth. In general, this does not occur even if a hearing loss is constant in amplitude across several critical bands of hearing. Failure to properly account for the adaptive full-range compression will result in degraded hearing or equivalently, loss of fidelity and intelligibility perceived by the hearing impaired listener. Therefore, mechanisms as disclosed, which do not provide a sufficient number of frequency bands to compensate for hearing losses, will produce sound which is of less benefit to the listener in terms of the quality (user preference) and intelligibility.

Several schemes have been proposed which use multiple bandpass filters followed by compression devices (see U.S. Pat. No. 4,396,806 to Anderson, U.S. Pat. No. 3,784,750 to Steams et al., and U.S. Pat. No. 3,989,904 to Rohrer).

One example of prior art in U.S. Pat. No. 5,029,217 to Chabries focused on a Fast Fourier Transform (FFT) frequency domain version of a human auditory model. As known to those skilled in the art, the FFT can be used to implement an efficiently-calculated frequency domain filter bank which provides fixed filter bands. As described herein, it is preferred to use bands that approximate the critical band equivalents which naturally occur in the ear due to its unique geometry and makeup. The use of critical bands for the filter bank design allows the construction of a hearing aid which employs wider bandwidths at higher frequencies while still providing the full hearing benefit. Because the resolution of the FFT filter bank must be set to the value of the smallest bandwidth from among the critical bands to be compensated, the efficiency of the FFT is in large part diminished by the fact that many additional filter bands are required in the FFT approach to cover the same frequency spectrum. This FFT implementation is complex and likely not suitable for low-power battery applications.

As known to those skilled in the art, prior-art FFT implementations introduce a block delay by gathering and grouping blocks of samples for insertion into the FFT algorithm. This block delay introduces a time delay into the sound stream which may be long enough to be annoying and to induce stuttering when one tries to speak. An even longer delay could occur which sounds like an echo when low levels of compensation are required for the hearing impaired individual.

For acoustic input levels below hearing threshold (i.e. soft background sounds which are ever present), the FFT implementation described above provides excessive gain. This results in artifacts which add noise to the output signal. At hearing compensation levels greater than 60 dB, the processed background noise level can become comparable to the desired signal level in intensity, thereby introducing distortion and reducing sound intelligibility.

As noted above, the hearing aid literature has proposed numerous solutions to the problem of hearing compensation for the hearing impaired. While the component parts that are required to assemble a high fidelity, full-range, adaptive compression system have been known since 1968, no one has to date proposed the application of the multiplicative AGC to the several bands of hearing to compensate for hearing losses.

As will be appreciated by those of ordinary skill in the art, there are three aspects to the realization of a high effectiveness aid for the hearing impaired. The first is the conversion of sound energy into electrical signals. The second is the processing of the electrical signals so as to compensate for the impairment of the particular individual which includes the suppression of noise from the acoustic signal being input to a hearing aid user while preserving the intelligibility of the acoustic signal. Finally, the processed electrical signals must be converted into sound energy in the ear canal.

Modern electret technology has allowed the construction of extremely small microphones with extremely high fidelity, thus providing a ready solution to the first aspect of the problem. The conversion of sound energy into electrical signals can be implemented with commercially available products. A unique solution to the problem of processing of the electrical signals to compensate for the impairment of the particular individual is set forth herein and in parent U.S. patent application Ser. No. 08/272,927 filed Jul. 8, 1994, (now U.S. Pat. No. 5,500,902). The third aspect has, however, proved to be problematic, and is addressed by the present invention.

An in-the-ear hearing aid must operate on very low power and occupy only the space available in the ear canal. Since the hearing-impaired individual has lower sensitivity to sound energy than a normal individual, the hearing aid must deliver sound energy to the ear canal having an amplitude large enough to be heard and understood. The combination of these requirements dictates that the output transducer of the hearing aid must have high efficiency.

To meet this requirement transducer manufacturers such as Knowles have designed special iron-armature transducers that convert electrical energy into sound energy with high efficiency. To date, this high efficiency has been achieved at the expense of extremely poor frequency response.

The frequency response of prior art transducers not only falls off well before the upper frequency limit of hearing, but also shows resonances starting at about 1 to 2 kHz, in a frequency range where they confound the information most useful in understanding human speech. These resonances significantly contribute to the feedback oscillation so commonly associated with hearing aids, and subject signals in the vicinity of the resonant frequencies to severe intermodulation distortion by mixing them with lower frequency signals. These resonances are a direct result of the mass of the iron armature, which is required to achieve good efficiency at low frequencies. In fact it is well known to those of ordinary skill in the art of transducer design that any transducer that is highly efficient at low frequencies will exhibit resonances in the mid-frequency range.

A counterpart to this problem occurs in high-fidelity loudspeaker design, and is solved in a universal manner by introducing two transducers, one that provides high efficiency transduction at low frequencies (a woofer), and one that provides high-quality transduction of the high frequencies (a tweeter). The audio signal is fed into a crossover network which directs the high frequency energy to the tweeter and the low frequency energy to the woofer. As will be appreciated by those of ordinary skill in the art, such a crossover network can be inserted either before or after power amplification.

From the above recitation, it should be appreciated that many approaches have been taken in the hearing compensation art to improve the intelligibility of the acoustic signal being input to the user of a hearing compensation device. These techniques include both compensating for the hearing deficits of the hearing impaired individual by various methods, and also for removing or suppressing those aspects of the acoustic signal, such as noise, that produce an undesirable effect on the intelligibility of the acoustic signal. Despite the multitude of approaches, as set forth above, that have been adopted to provide improved hearing compensation for hearing impaired individuals, there remains ample room for improvement.

BRIEF DESCRIPTION OF THE INVENTION

According to the present invention, a hearing compensation system comprises a plurality of bandpass filters having an input connected to an input transducer and each bandpass filter having an output connected to the input of one of a plurality of multiplicative AGC (automatic gain control) circuits (MAGC circuits) whose outputs are summed together and connected to the input of an output transducer.

The MAGC circuits attenuate acoustic signals having a constant background level without removing the portions of the speech signal which contribute to intelligibility. The identification of the background noise portion of the acoustic signal is made by the constancy of the envelope of the input signal in each of the several frequency bands. It is presently contemplated that examples of background noise that will be suppressed according to the present invention include multi-talker speech babble, fan noise, feedback whistle, florescent light hum, and white noise.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
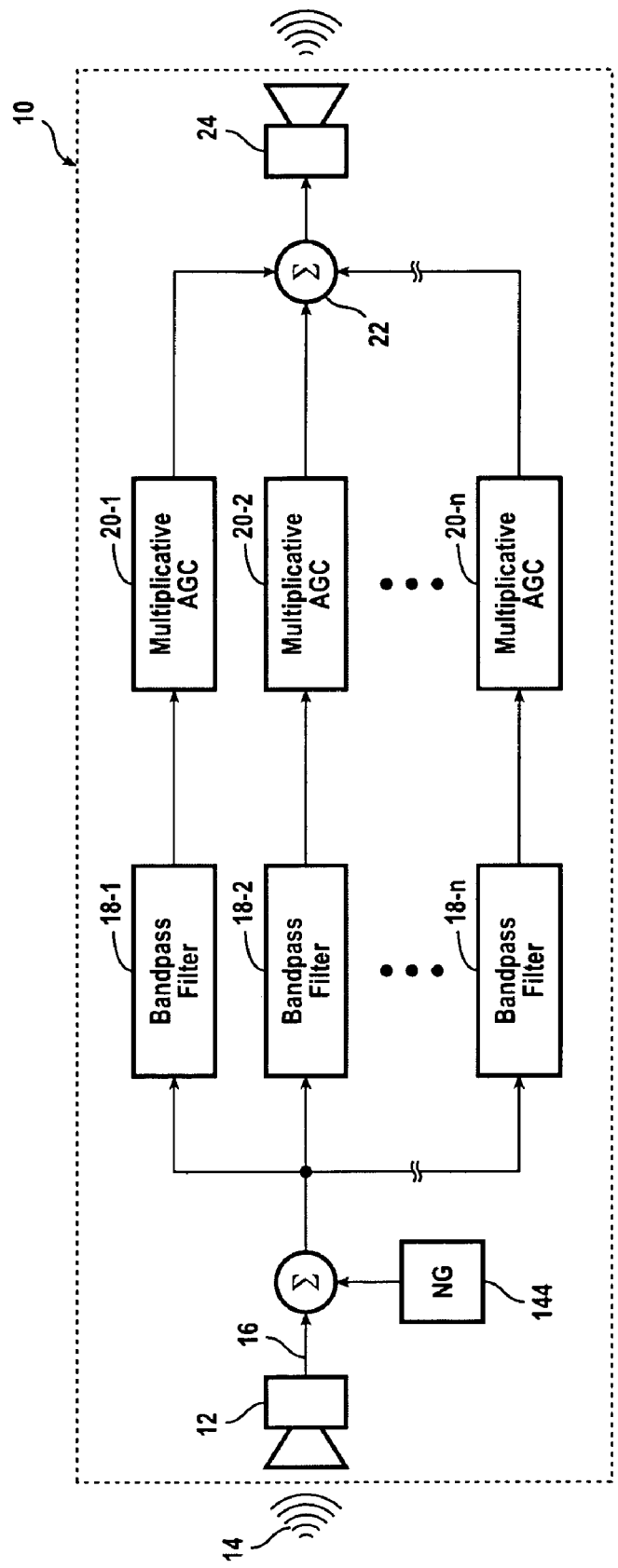
FIG. 1 is a block diagram of a multiplicative automatic gain control (MAGC) hearing compensation system in accordance with the present invention.

Embodiments of the present invention are described herein in the context of a hearing compensation system incorporating signal processing techniques. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

It has been discovered that the appropriate approach to high fidelity hearing compensation is to separate the input acoustic stimulus into frequency bands with a resolution at least equal to the critical bandwidth, which for a large range of the sound frequency spectrum is less than ⅓ octave, and apply a multiplicative AGC with either a fixed or variable exponential gain coefficient for each band.

According to the present invention, the multiplicative AGC circuits attenuate acoustic signals having a constant background level without removing the portions of the speech signal which contribute to intelligibility. The portion of the input signal which comprises the background noise portion of the acoustic signal is attenuated in amplitude without distortion to preserve the intelligibility of the acoustic input signal. The identification of the background noise portion of the acoustic signal is made by the constancy of the envelope of the input signal in each of the several frequency bands, as will be described below.

During highly dynamic variations in sound level, the output signal of the hearing compensation circuit due to its noise suppression feature will be nearly the same as the output of the hearing compensation system without such noise suppression features, and that during the quiescent periods between words that the output signal will have a significantly quieter background level due to the noise suppression of the present invention. It is presently contemplated that examples of background noise that will be suppressed according to the present invention include multi-talker speech babble, fan noise, feedback whistle, florescent light hum, other colored noise and white noise.

Those of ordinary skill in the art will recognize that the principles of the present invention may be applied to audio applications other than just hearing compensation for the hearing impaired. Non-exhaustive examples of other applications of the present invention include music playback for environments with high noise levels, such as automotive environments, voice systems in factory environments, and graphic sound equalizers such as those used in stereophonic sound systems.

As will be appreciated by persons of ordinary skill in the art, the circuit elements of the hearing compensation apparatus of the present invention may be implemented as either an analog circuit or as a digital circuit, preferably a microprocessor or other computing engine performing digital signal processing (DSP) functions to emulate the analog circuit functions of the various components such as filters, amplifiers, etc. It is presently contemplated that the DSP version of the circuit is the preferred embodiment of the invention, but persons of ordinary skill in the art will recognize that an analog implementation, such as might be integrated on a single semiconductor substrate, will also fall within the scope of the invention. Such skilled persons will also realize that in a DSP implementation, the incoming audio signal will have to be time sampled and digitized using conventional analog to digital conversion techniques.

Referring first to FIG. 1, a block diagram of a hearing compensation system 10 in accordance with the present invention is shown. The hearing compensation system 10 includes in one embodiment an input transducer (or microphone) 12 for converting acoustical energy (shown schematically at reference numeral 14) into an electrical signal on line 16 corresponding to that acoustical energy. Various known hearing-aid microphone transducers, such as a model EK 3024, available from Knowles Electronics of Ithaca, Ill., are available for use as input transducer 12, or other microphone devices may be employed.

In FIG. 1, three audio bandpass filters are shown at reference numerals 18-1, 18-2 . . . 18-n. According to one embodiment of the present invention, n will be an integer from 9 to 15, although persons of ordinary skill in the art will now understand that the present invention will function even if n is a different integer.

Accordingly, these are in one embodiment of the present invention n audio bandpass filters 18-1 to 18-n having a bandpass resolution of approximately ½ octave. The bandpass filters 18-1 through 18-n may be realized as fifth-order Chebychev band-split filters which provide smooth frequency response in the passband and about 65 dB attenuation in the stopband. The design of such ½ octave bandpass filters is well within the level of skill of those of ordinary skill in the art. Therefore the details of the circuit design of any particular bandpass filter, whether implemented as an analog filter or as a DSP representation of an analog filter, will be simply a matter of design choice for such skilled persons.

In an alternative embodiment, audio bandpass filters 18-1 to 18-n may have a bandpass resolution of ⅓ octave or less, but in no case less than about 125 Hz, and have their center frequencies logarithmically spaced over a total audio spectrum of from about 200 Hz to about 10,000 Hz. The audio bandpass filters may have bandwidths broader than ⅓ octave, i.e., up to an octave or so, but with degrading performance. In this alternative embodiment, the bandpass filters 18-1 through 18-n may be realized as eighth-order Elliptic filters with about 0.5 dB ripple in the passband and about 70 dB rejection in the stopband.

Those of ordinary skill in the art will now recognize that several bandpass filter designs including, but not limited to, other Elliptic, Butterworth, Chebyshev, or Bessel filters, may be employed. Further, filter banks designed using wavelets, as disclosed, for example, in R. A. Gopinath, *Wavelets and Filter Banks—New Results and Applications*, Ph.D Dissertation, Rice University, Houston, Tex., (May, 1993), may offer some advantage. Any of these bandpass filter designs may be employed without deviating from the concepts of the invention disclosed herein.

Each individual bandpass filter 18-1 to 18-n is cascaded with a corresponding multiplicative automatic gain control (AGC) circuit. Three such devices 20-1, 20-2, and 20-n are shown in FIG. 1. Multiplicative AGC circuits are known in the art and an exemplary configuration will be disclosed further herein.

The outputs of the multiplicative AGC circuits 20-1 to 20-n are summed together with summing circuitry 22 and are then fed to an output transducer 24, which converts electrical signals into acoustical energy. As will now be appreciated by those of ordinary skill in the art, output transducer 24 may be one of a variety of known available hearing-aid earphone transducers, such as a model ED 1932, available from Knowles Electronics of Ithaca, Ill., used in conjunction with a calibrating amplifier to ensure the transduction of a specified electrical signal level into the correspondingly specified acoustical signal level. Alternately, output transducer 24 may be another earphone-like device or an audio power amplifier and speaker system, as appropriate to the specific application.

Figure 2A:
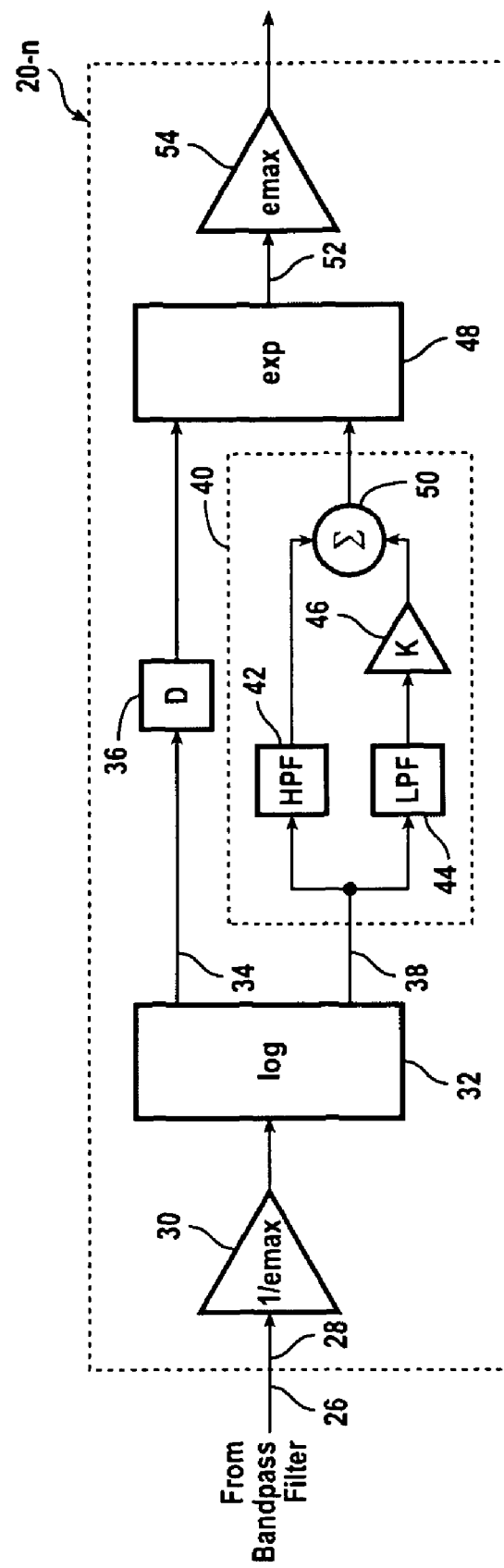
FIG. 2A is a block diagram of a first embodiment of a MAGC circuit suitable for use in accordance with the present invention.

Referring now to FIG. 2A, a more detailed conceptual block diagram of a typical multiplicative AGC circuit 20-n suitable for use in accordance with the present invention is shown. As previously noted, multiplicative AGC circuits are known in the art. An illustrative multiplicative AGC circuit which will function in the present invention is disclosed in this article: T. Stockham, Jr., *The Application of Generalized Linearity to Automatic Gain Control*, IEEE Transactions on Audio and Electroacoustics, vol. AU-16, No. 2, pp. 267-270 (June, 1968). A similar example of such a multiplicative AGC circuit may be found in U.S. Pat. No. 3,518,578 to Oppenheim et al.

Conceptually, the multiplicative AGC circuit 20-n which may be used in the present invention accepts an input signal on line 26 at input 28 to amplifier 30 from the output of one of the audio bandpass filters 18-n. Amplifier 30 is set to have a gain of $1/e_{max}$, where $e_{max}$ is the maximum allowable value of the audio envelope for which AGC gain is applied (i.e., for input levels above $e_{max}$, AGC attenuation results). Within each band segment in the apparatus of the present invention, the quantity $e_{max}$ is the maximum acoustic intensity for which gain is to be applied. This gain level for $e_{max}$ (determined in the hearing aid context by audiological examination of a patient) often corresponds to the upper comfort level of sound. In an analog implementation of the present invention, amplifier 30 may be a known operational amplifier circuit, and in a DSP implementation, amplifier 30 may be a multiplier function having the input signal as one input term and the constant $1/e_{max}$ as the other input term.

The output of amplifier 30 is processed in the "LOG" block 32 to derive the logarithm of the signal. The LOG block 32 derives a complex logarithm of the input signal, with one output representing the sign of the input signal and the other output representing the logarithm of the absolute value of the input. Those of ordinary skill in the art will now recognize that by setting the gain of the amplifier 30 to $1/e_{max}$, the output of amplifier 30 (when the input is less than $e_{max}$), will never be greater than one and the logarithm term out of LOG block 32 will always be zero or less.

In a DSP implementation, LOG block 32 is realized preferably by employing a circuit that converts binary numbers to a floating point format in a manner consistent with the method described in ADSP-2100 *Family Applications Handbook*, published by Analog Devices, pp. vol. 1, 46-48 (1995). In this implementation, several different bases for the logarithm may be employed. The LOG block 32 may be alternatively implemented as a software subroutine running on a microprocessor or similar computing engine as is well known in the art, or from other equivalent means such as a look-up table. Examples of such implementations are found in Knuth, Donald E., *The Art of Computer Programming, Vol. 1: Fundamental Algorithms*, Addison-Wesley Publishing pp. 21-26 1968, and Abramowitz, M. and Stegun, I. A., *Handbook of Mathematical Functions*, US Department of Commerce, National Bureau of Standards, Appl. Math Series 55, (1968).

Figure 8:
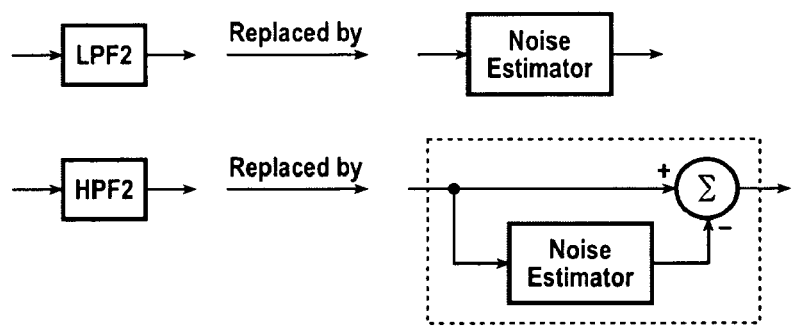
FIG. 8 is a block diagram illustrating a noise estimator suitable for replacing the filters depicted in FIGS. 5C and 5D in accordance with the present invention.

In an analog implementation of the present invention, LOG block 32 may be, for example, an amplifier having a logarithmic transfer curve, or a circuit such as the one shown in FIGS. 8 and 9 of U.S. Pat. No. 3,518,578.

Figure 3:
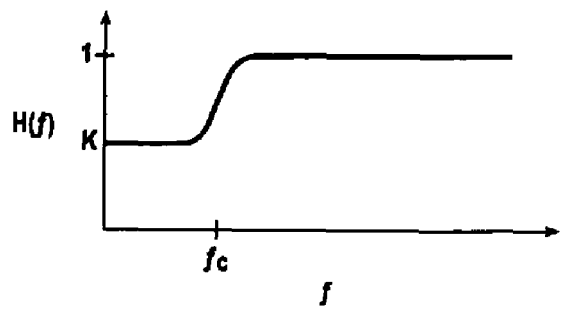
FIG. 3 is a graph of the response characteristics of the filter employed in the MAGC circuit of FIG. 2A.

The first output 34 of LOG block 32 containing the sign information of its input signal is presented to a Delay block 36, and a second output 38 of LOG block 32 representing the logarithm of the absolute value of the input signal is presented to a filter 40 having a characteristic preferably like that shown in FIG. 3. Conceptually, filter 40 may comprise both highpass filter 42 and low-pass filter 44 followed by amplifier 46 having a gain equal to K, where, as shown in FIG. 3, gain factor K has a value less than 1 at frequencies below $f_c$. It should be noted that the gain factor K shown in FIG. 3 may be chosen to be a different value for each of the multiplicative AGC circuits 20-1 through 20-n, but, once chosen for that channel, the value of K will remain constant. As will now be appreciated by those of ordinary skill in the art, high-pass filter 42 may be synthesized by subtracting the output of the low-pass filter 44 from its input.

Both high-pass filter 42 and low-pass filter 44 have a cutoff frequency that is determined by the specific application. In a hearing compensation system application according to the embodiments depicted in FIGS. 2A-2C, where the LOG operation is performed prior to the low-pass operation, it is presently preferred that a nominal cutoff frequency of about 16 Hz be employed. However, it should be appreciated that other cutoff frequencies may be chosen for low-pass filter 44 up to about ⅛ of the critical bandwidth associated with the frequency band being processed without deviating from the concepts of this invention. Those of ordinary skill in the art will now recognize that filters having response curves other than that shown in FIG. 3 may be used with the present invention. For example, other non-voice applications of the present invention may require a cutoff frequency higher or lower than $f_c$=16 Hz.

The sign output 34 of the LOG block 32 which feeds delay 36 has a value of either 1 or 0 and is used to keep track of the sign of the input signal to LOG block 32. The delay 36 is such that the sign of the input signal is fed to the EXP block 48 at the same time as the data representing the absolute value of the magnitude of the input signal, resulting in the proper sign at the output. In accordance with the present invention, the delay is made equal to the delay of the high-pass filter 42.

Those of ordinary skill in the art will now recognize that many designs exist for amplifiers and for both passive and active analog filters as well as for DSP filter implementations, and that the design for the filters described herein may be elected from among these available designs. For example, in an analog implementation of the present invention, high-pass filter 42 and low-pass filter 44 may be conventional high-pass and low-pass filters of known designs, such as examples found in Van Valkenburg, M. E., *Analog Filter Design, Holt, Rinehart and Winston*, pp. 58-59 (1982). Amplifier 46 may be a conventional operational amplifier. In a digital implementation of the present invention, amplifier 46 may be a multiplier function having the input signal as one input term and a constant K as the other input term. DSP filter techniques are well understood by those of ordinary skill in the art.

The outputs of high-pass filter 42 and amplifier 46 are combined (i.e. added together) at summer 50 and presented to an input of EXP block 48 along with the unmodified but delayed output of LOG block 36. EXP block 48 processes the signal to provide an exponential function. The sign of the output 52 from EXP block 48 is determined by the output from the delay D block 36. In a DSP implementation, EXP block 48 is preferably realized as described in *ADSP*-2100 *Family Applications Handbook*, published by Analog Devices, vol. 1, pp. 52-67 (1995). EXP block 48 preferably has a base that corresponds to the base employed by LOG block 32. The EXP block 48 may alternatively be implemented as a software subroutine as is well known in the art, or from other equivalent means such as a look-up table. Examples of known implementations of this function are found in the Knuth and Abramowitz et al. references and in U.S. Pat. No. 3,518,578, referred to above.

In an analog implementation of the present invention, EXP block 48 may be an amplifier with an exponential transfer curve. Examples of such circuits are found in FIGS. 8 and 9 of U.S. Pat. No. 3,518,578 discussed above.

Sound may be conceptualized as the product of two components. The first is the always positive slowly varying envelope which may be written as e(t), and the second is the rapidly varying carrier which may be written as v(t). The total sound may be expressed as:

$$s(t)=e(t)\cdot v(t)$$

which is the input to block 30 of FIG. 2A.

Since an audio waveform is not always positive (i.e., v(t) is negative about half of the time), its logarithm at the output of LOG block 32 will have a real part and an imaginary part. If LOG block 32 is configured to process the absolute value of s(t) scaled by $e_{max}$, its output will be the sum of log $[e(t)/e_{max}]$ and log |v(t)|. Since log |v(t)| contains high frequencies, it will pass through high-pass filter 42 essentially unaffected. The component log $[e(t)/e_{max}]$ contains low frequency components and will be passed by low-pass filter 44 and emerges from amplifier 46 as K log $[e(t)/e_{max}]$. The output of EXP block 48 will therefore be:

$$(e(t)/e_{max})K\cdot v(t)$$

The output of EXP block 48 is fed into amplifier 54 with a gain of $e_{max}$ in order to rescale the signal to properly correspond to the input levels which were previously scaled by $1/e_{max}$ in amplifier 30. Amplifiers 30 and 54 are similarly configured except that their gains differ as just explained.

When K<1, it may be seen that the processing in the multiplicative AGC circuit 20-n of FIG. 2A performs a compression function. Persons of ordinary skill in the art will recognize that embodiments of the present invention using these values of K are also useful for applications other than hearing compensation.

According to such embodiments of the present invention as are employed as a hearing compensation system, K may be a variable with a value between zero and 1. The value of K will be different for each frequency band for each hearing impaired person, and may be defined as follows:

$$K=[1-(HL/(UCL-NHT)]$$

where HL is the hearing loss at threshold (in dB), UCL is the upper comfort level (in dB), and NHT is the normal hearing threshold (in dB). Thus, the apparatus of the present invention may be customized to suit the individual hearing impairment of the wearer as determined by conventional audiological examination. The multiplicative AGC circuit 20-n in accordance with one embodiment of the present invention provides either no gain for signal intensities at the upper sound comfort level or a gain equivalent to the hearing loss for signal intensities associated with the normal hearing threshold in that frequency band.

Figure 2B:
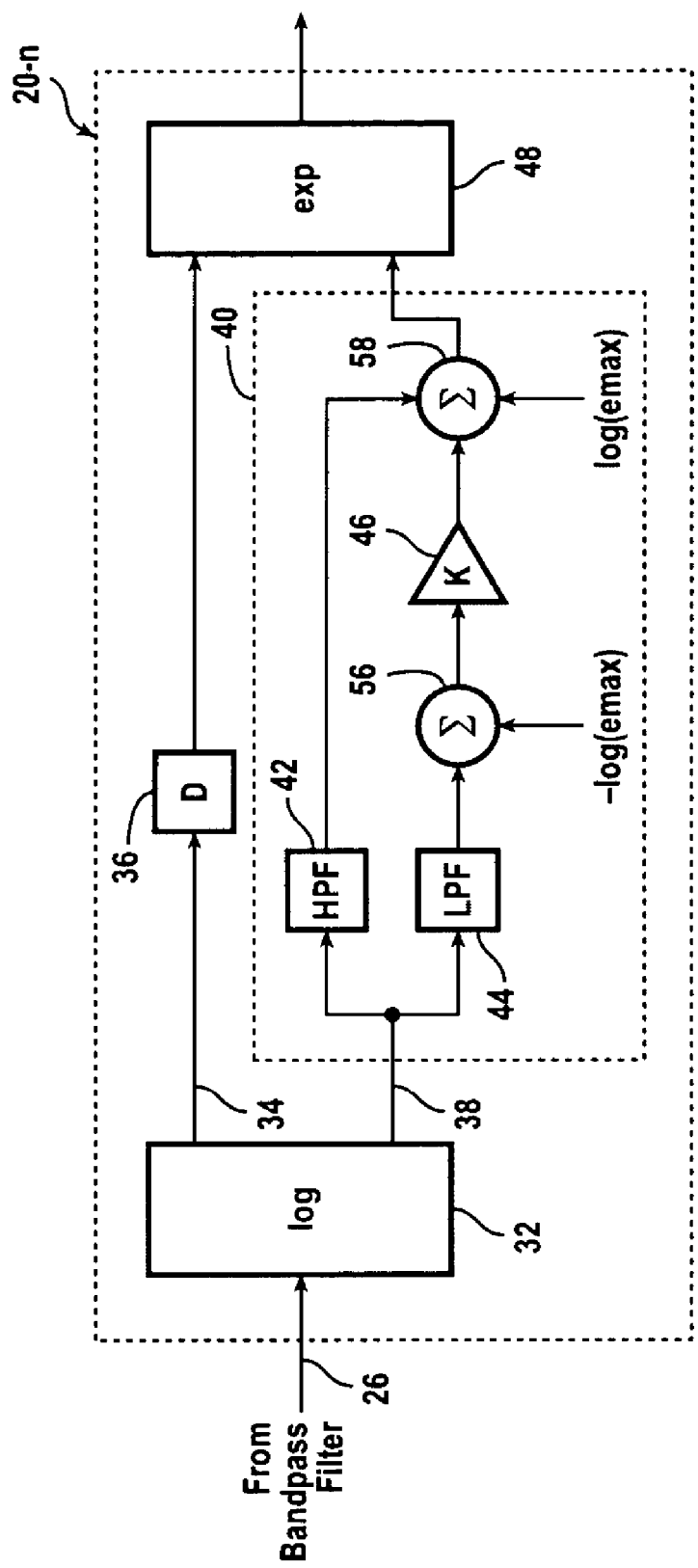
FIG. 2B is a block diagram of an alternative embodiment of the MAGC circuit shown in FIG. 2A suitable for use in accordance with the present invention.
Figure 2C:
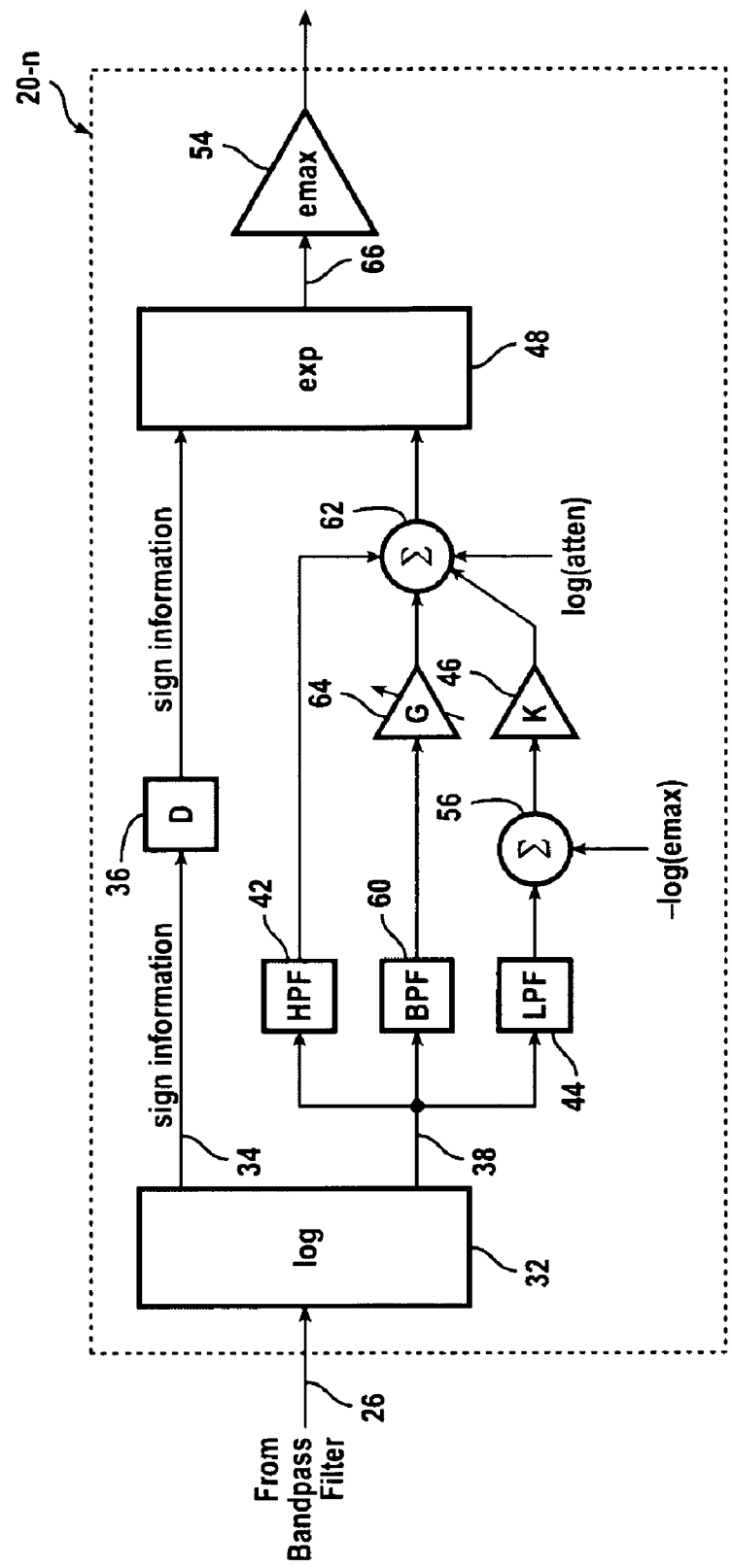
FIG. 2C is a block diagram of a first embodiment of a MAGC circuit with noise suppression in accordance with the present invention.

In embodiments of the block diagram shown in FIGS. 2A-2C, when K>1, the multiplicative AGC circuit 20-n becomes an expander. Useful applications of such a circuit include noise reduction by expanding a desired signal.

In contrast, those of ordinary skill in the art will now recognize that embodiments of the block diagrams shown in FIGS. 2A-2C where the value of K is negative (in a typical useful range of about zero to negative one), soft sounds will become loud and loud sounds will become soft. Useful applications of the present invention in this mode include systems for improving the intelligibility of a low volume audio signal on the same signal line with a louder signal.

Despite the fact that multiplicative AGC has been available in the literature since 1968, and has been mentioned as having potential applicability to hearing aid circuits, it has been largely ignored by the hearing aid literature. Researchers have agreed, however, that some type of frequency dependent gain is necessary to provide adequate hearing compensation and noise suppression, since hearing loss is also frequency dependent. Yet even this agreement is clouded by perceptions that a bank of filters with AGC will destroy speech intelligibility if more than a few frequency bands are used, see, e.g., R. Plomp, *The Negative Effect of Amplitude Compression in Hearing Aids in the Light of the Modulation-Transfer Function*, Journal of the Acoustical Society of America, vol. 83, No. 6, pp. 2322-2327 (June 1983). An approach, whereby a separately configured multiplicative AGC for a plurality of sub-bands across the audio spectrum may be used according to the present invention is a substantial advance in the art.

FIG. 2B is a block diagram of a variation of the circuit shown in FIG. 2A. Persons of ordinary skill in the art will now recognize that amplifier 30 may be eliminated and its gain ($1/e_{max}$) may be equivalently implemented by subtracting the value $\log [e_{max}]$ from the output of low pass filter 44 in subtractor circuit 56. Similarly, in FIG. 2B, amplifier 54 has been eliminated and its gain ($e_{max}$) has been equivalently implemented by adding the value $\log [e_{max}]$ to the output from amplifier 46 in adder circuit 58 without departing from the concept of the present invention. In a digital embodiment of FIG. 2B, the subtraction or addition may be achieved by simply subtracting/adding the amount $\log [e_{max}]$; while in an analog implementation, a summing amplifier such as shown in examples in, A. S. Sedra and K. C. Smith, *Microelectronic Circuits* Holt Rinehart and Winston, pp. 62-65, (1990), may be used.

When noise is present, the input signal to the multiplicative system may be characterized as follows:

$$s(t)=[e_d(t) \times e_n(t)]v(t)$$

where $e_d(t)$ is the dynamic part of the envelope, and $e_n(t)$ is the near stationary part of the envelope.

According to another embodiment of the multiplicative AGC circuit 20-n in accordance with the present invention, FIG. 2C illustrates noise suppression that is performed on the near stationary parts of the envelope, $e_n(t)$. In FIG. 2C, the second output of LOG block 32 is connected to high pass filter 42, bandpass filter 60, and low-pass filter 44. The high pass filter 42 is preferably set to 16 Hz as described above to separate $\log |v(t)|$ and $\log [e_d(t) \times e_n(t)]$ which is equivalently $\log [e_d(t)] + \log [e_n(t)]$, where $e_d(t)$ and $e_n(t)$ are positive quantities.

In accordance with this embodiment, the bandpass filter 60 may be implemented with a single order pole at 16 Hz that is consistent with the desired operation of separating the log $[e_d(t)]$ and log $[e_n(t)]$ signals of the envelope amplitude and a zero (i.e. a zero response) at direct current (D.C.) (an example of an implementation of a bandpass filter transfer function which provides this response is shown in FIG. 4B). According to the present invention, sounds that remain nearly constant in envelope amplitude for more than 6 seconds are characterized as stationary. Accordingly, the specification of the lower cut-off frequency to be ⅙ Hz for the band-pass filter 60 corresponds to signals with a 6 second duration. It will now be appreciated by those of ordinary skill in the art that other cut-off frequencies and filter orders may be selected to implement the desired specifications for separating the log $[e_d(t)]$ and log $[e_n(t)]$ signal portions of the envelope in accordance with the present invention.

Figure 4A:
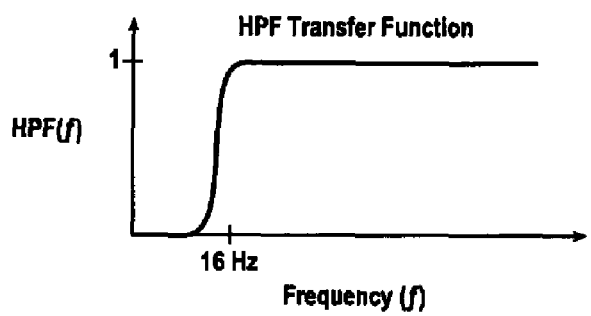
FIGS. 4A-4C are graphs of the response characteristics (transfer functions) of the HPF, BPF and LPF filters employed in the MAGC circuit of FIG. 2C in accordance with the present invention.
Figure 4B:
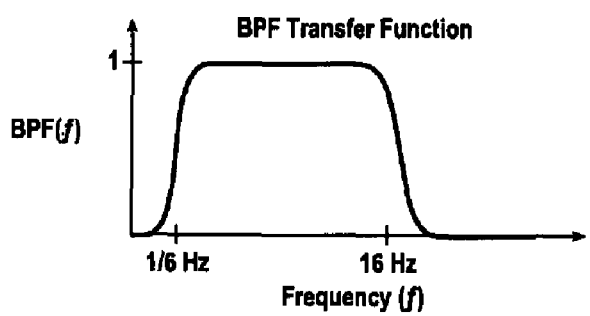
Figure 4C:
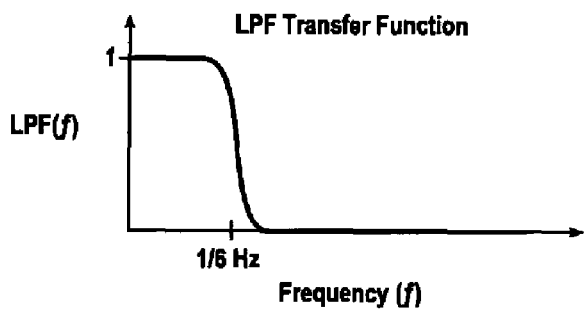

FIGS. 4A-4C illustrate the transfer functions of the high pass filter 42, the bandpass filter 60 and the low pass filter 44, respectively. In FIG. 4A, the output of the high pass filter 42 is the log $|v(t)|$. In FIG. 4B, the output of the bandpass filter 60, is the logarithm of the dynamic or rapidly varying time envelope, often associated with speech, such as for log $[e_d(t)]$. In FIG. 4C, the output of the low pass filter 44 is the logarithm of the near stationary or slowly varying time envelope, log $[e_n(t)]$. The near stationary envelope is most often associated with noise such as a multi-talker speech background that provides a constant din, a fan with a constant level of output hum, or white or colored noise with a constant power level.

According to the present invention, the noise, $e_n(t)$, may be reduced by a linear attenuation factor, atten, wherein the amplitude is changed so as to equal the original amplitude times the atten factor. A reduction in the level of the constant component of sound (i.e., the near stationary envelope) is obtained by adding the logarithm of the attenuation to the log $[e_n(t)]$. Referring now to FIG. 2C, log [atten], the value of which is negative for atten values less than one, is added at summing node 62 to the output of the amplifier 46. It should be appreciated that the inclusion of $-\log [e_{max}]$ is made in place of the amplifier 30 as taught with respect to node 56 illustrated in FIG. 2B.

Still referring to FIG. 2C, the outputs of the amplifiers 46 and 64 along with the output of high pass filter 42 are added with the log [atten] factor at the summing node 62 with the output connected as an input to the exponentiation block 48.

The value of gain G selected for amplifier block 64 is determined by the amount of desired enhancement to be applied to the dynamic portions of speech. In the present invention the value of G is selected to be in the range $$K \le G \le K - \frac{\log(atten)}{\log(e_{dmax})}$$

where $e_{dmax}$ is the level of the dynamic or speech portion which the designer prefers to be restored to the signal level as if there were no noise attenuation. In the preferred embodiment, $e_{dmax}$ is set to value of the comfortable listening level and the attenuation value is set to 0.1. Hence, with this choice of variables, the output signal is attenuated by a factor of 0.1 but the dynamic portion of the envelope is amplified by a factor G to provide enhancement. Those of ordinary skill in the art will now understand that other values of G may be selected to provide specific desired output levels for the dynamic portions of the signal envelope, including a time varying calculation for values of G based upon short term averages of the output of BPF 60 (or equivalently log $[e_d(t)]$), without deviating from the teachings of this invention.

The output of summing junction 62 is connected to the second input of exponent block 48. The first input of exponent block 48 contains the sign information of v(t), and, when combined with the input at the second input of exponent block 48, forms an output of exponent block 48 on line 66 as follows:

$$atten \cdot \left(\frac{e_n}{e_{max}}\right)^K (e_d)^G v(t)$$

Accordingly, the multiplicative AGC circuit 20-n set forth in FIG. 2C will attenuate an acoustic signal having a relatively constant amplitude for more than approximately six seconds but will provide increased gain (by virtue of the constant G) to dynamic and speech signals. Preferably, the value of atten, the logarithm of which is added at the summing junction block 62 may be under the control of the user of the hearing aid. In this manner, the user of the hearing aid may set the background noise attenuation in a way that is analogous to the selection of volume by a volume control. It will now be appreciated by those of ordinary skill in the art that any variety of known volume control devices typically employed in hearing aids or stereo sound systems may be employed to adjust the background noise attenuation level in either a digital or an analog system.

Figure 5A:
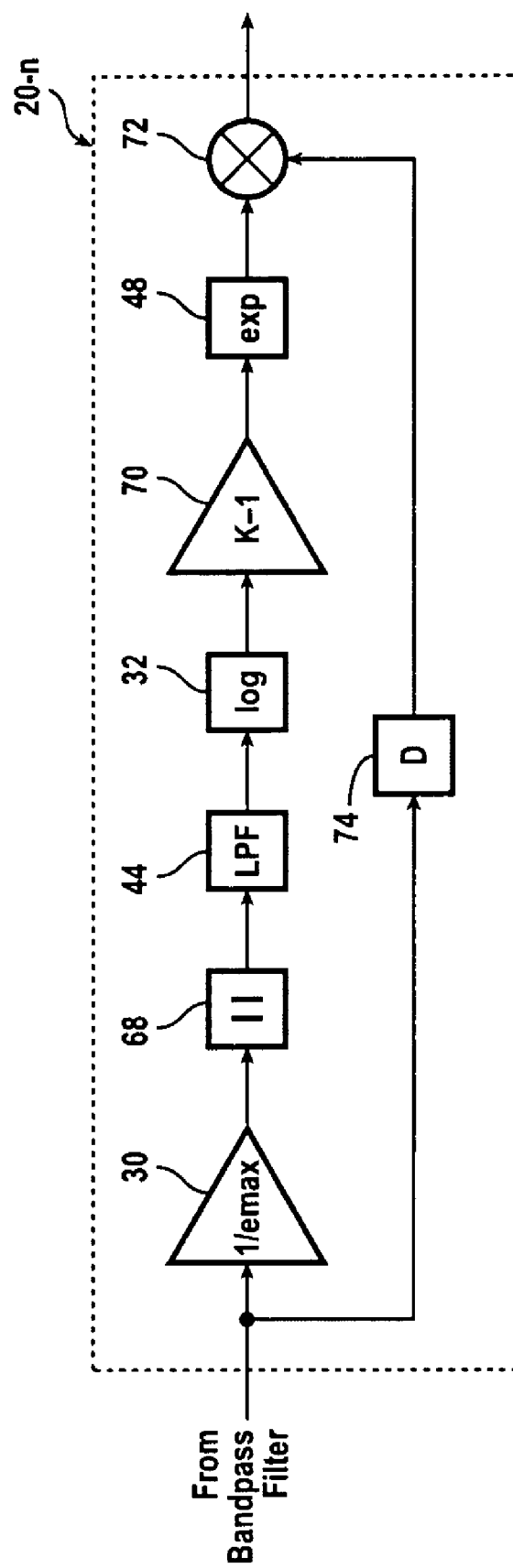
FIG. 5A is a block diagram of a second embodiment of a MAGC circuit suitable for use in accordance with the present invention.

Referring now to FIG. 5A, a block diagram is presented of an alternate embodiment of the multiplicative AGC circuit 20-*n* of the present invention wherein the logarithm function follows the low-pass filter function. Those of ordinary skill in the art will now appreciate that the individual blocks of the circuit of FIG. 5A which have the same functions as corresponding blocks of the circuit of FIG. 2A may be configured from the same elements as the corresponding ones of the blocks of FIG. 2A.

Like the multiplicative AGC circuit 20-*n* of FIG. 2A, the multiplicative AGC circuit 20-*n* of FIG. 5A accepts an input signal at amplifier 30 from the output of one of the audio bandpass filters 18-*n* shown in FIG. 1. Still referring to FIG. 5A, amplifier 30 is set to have a gain of $1/e_{max}$, where $e_{max}$ is the maximum allowable value of the audio envelope for which AGC gain is to be applied.

The output of amplifier 30 is passed to absolute value circuit 68. In an analog implementation, there are numerous known ways to implement absolute value circuit 68, such as given, for example, in A. S. Sedra and K. C. Smith, *Microelectronic Circuits*, Holt, Rinehart and Winston Publishing Co., 2nd ed. (1987). In a digital implementation, those skilled in the art know that the absolute value circuit can be implemented by simply by taking the magnitude of the digital number at the input of the circuit.

The output of absolute value circuit 68 is passed to low-pass filter 44. Low-pass filter 44 may be configured in the same manner as disclosed with reference to FIG. 2A. Those of ordinary skill in the art will now recognize that the combination of the absolute value circuit 68 and the low-pass filter 44 provides an estimate of the envelope e(t), and hence is known as an envelope detector. Several implementations of envelope detectors are well known in the art and may be used without departing from the teachings of the invention. Since, in the embodiment of FIG. 5A, the low-pass filter 44 precedes the LOG block 32, it is preferred that the cutoff frequency be up to ⅛ of the critical bandwidth of the cutoff frequency. It should be appreciated, however, that a nominal cutoff frequency of 16 Hz may also be employed.

In accordance with an embodiment of the present invention, the output of low-pass filter 44 is processed in the LOG block 32 to derive the logarithm of the signal. The input to the LOG block 32 is always positive due to the action of absolute value block 68, hence no phase or sign term from the LOG block 32 is used. Again, because the gain of the amplifier 30 is set to $1/e_{max}$, the output of amplifier 30 for inputs less than $e_{max}$, will never be greater than one and the logarithm term out of LOG block 32 will always be zero or less.

In FIG. 5A, an alternative implementation of LOG block 32 from the description provided with respect to FIG. 2A may be made, because less accuracy is required in the LOG block 32 implementation in FIG. 5A. It should be understood that this alternative implementation is not considered suitable for use in the implementation of LOG block 32 of FIG. 2A because an unacceptably high level of noise is created by the inaccuracies. In this alternative embodiment of LOG block 32, the exponent and the fractional part of the mantissa of the floating point representation of the input to LOG block 32 are added together to form the output of the LOG block 32. For example, the floating point representation of the number 12 pursuant to IEEE standard 754-1985 format is $1.5 \times 2^3$. In accordance with the alternative implementation of LOG block 22, the value of $\log_2 12$ is treated as 3.5, since the sum of the exponent of $2^3$ and the fractional part of 1.5 is calculated as 3+0.5=3.5. The true value of $\log_2 12$ is 3.58496. The error of approximately 2% is considered acceptable in this embodiment.

The logarithmic output signal of LOG block 32 is presented to an amplifier 70 having a gain equal to (K−1). Other than its gain being different from amplifier 46 of FIG. 2A, amplifiers 46 and 70 may be similarly configured. The output of amplifier 70 is presented to the input of EXP block 48, which processes the signal to provide an exponential (antilog) function.

The output of EXP block 48 is combined with a delayed version of the input to amplifier 30 in multiplier 72, where delay element 74 functions to provide the appropriate amount of delay. There are a number of known ways to implement multiplier 72. In a digital implementation, this is simply a multiplication of two digital values. In an analog implementation, an analog multiplier such as shown in A. S. Sedra and K. C. Smith, *Microelectronic Circuits*, Holt, Rinehart and Winston Publishing Co., 3rd ed., (1991) (see especially page 900) is required.

As in the embodiment depicted in FIG. 2A, the input to amplifier 30 of the embodiment of FIG. 5A is delayed prior to presentation to the input of multiplier 72. Delay block 74 has a delay equal to the group delay of low pass filter 44.

Figure 5B:
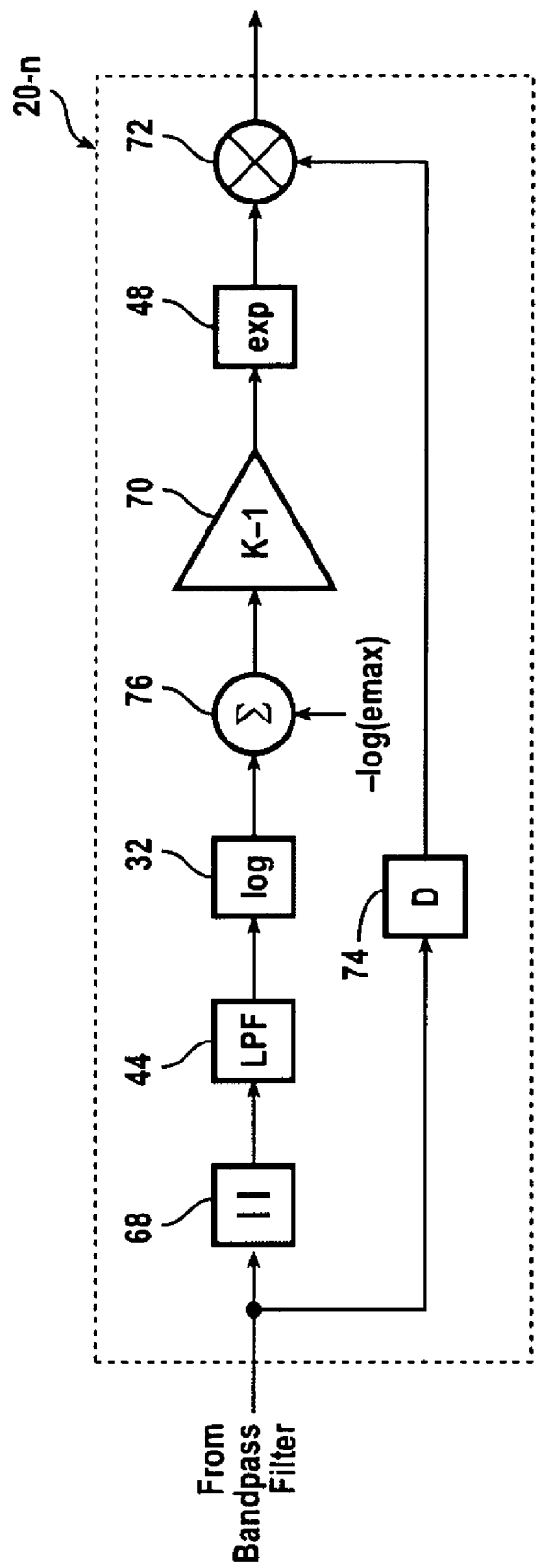
FIG. 5B is a block diagram of an alternative embodiment of the MAGC circuit shown in FIG. 5A suitable for use in accordance with the present invention.

FIG. 5B is a block diagram of a circuit which is a variation of the circuit shown in FIG. 5A. Those of ordinary skill in the art will now recognize that amplifier 30 may be eliminated and its gain, $1/e_{max}$, may be equivalently implemented by subtracting the value $\log[e_{max}]$ from the output of LOG block 32 in summing circuit 76, as shown in FIG. 5B, without deviating from the concepts herein.

Figure 5C:
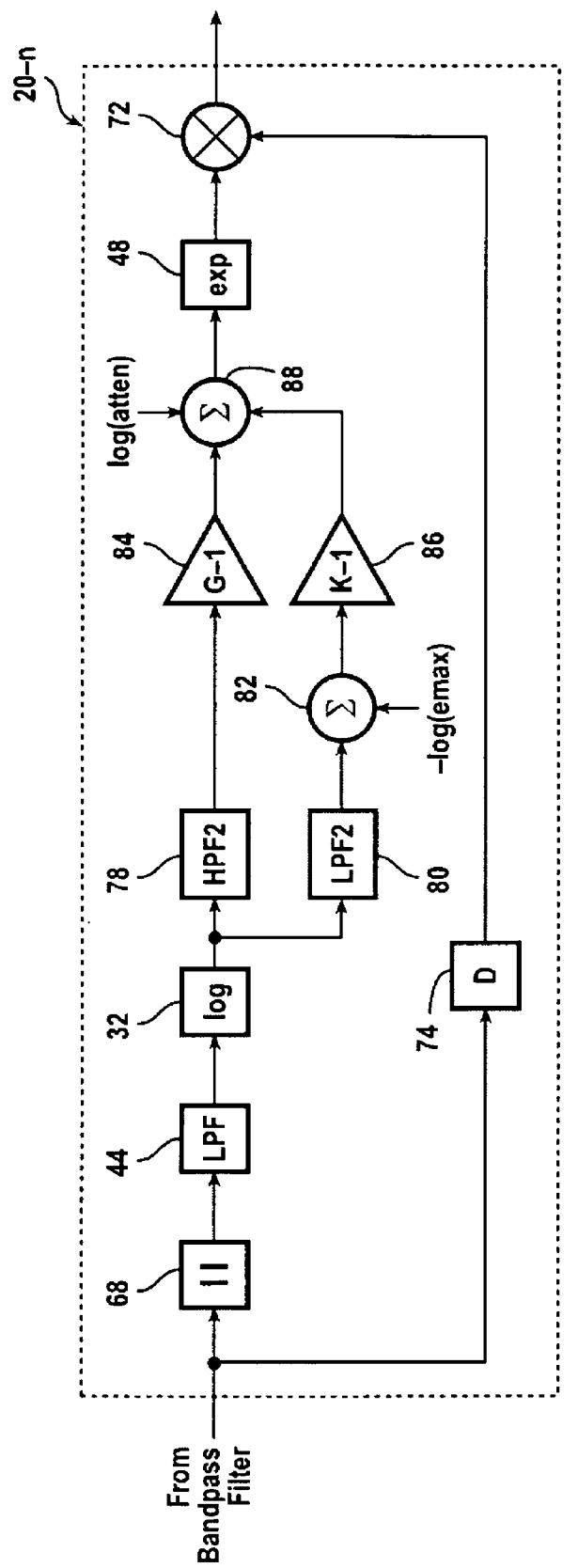
FIG. 5C is a block diagram of a second embodiment of a MAGC circuit with noise suppression in accordance with the present invention.

FIG. 5C illustrates an embodiment of a multiplicative AGC circuit 20-*n* including noise suppression in accordance with an embodiment of the present invention. The multiplicative AGC circuit 20-*n* is similar to the multiplicative AGC circuit 20-*n* depicted in FIGS. 5A and 5B, except that the noise suppression components according to the present invention have been included. Accordingly, only the additional circuit elements illustrated in FIG. 5C will be described herein.

Figure 6:
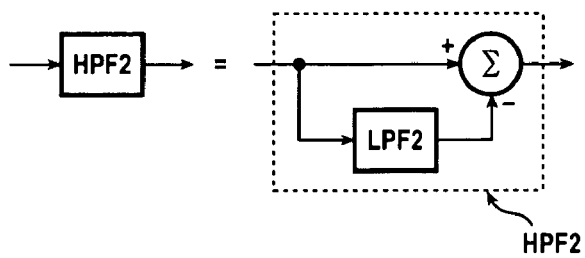
FIG. 6 is the implementation of a high pass filter suitable for use in accordance with the present invention.
Figure 7A:
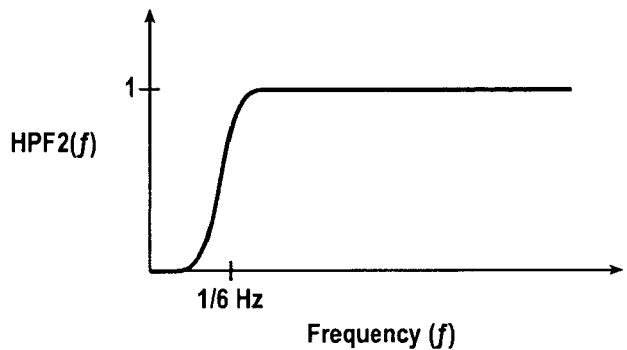
FIGS. 7A and 7B are graphs of the response characteristics (transfer functions) of the HPF2 and LPF2 filters employed in the MAGC circuits of FIGS. 5C, 5D, and 5E in accordance with the present invention.
Figure 7B:
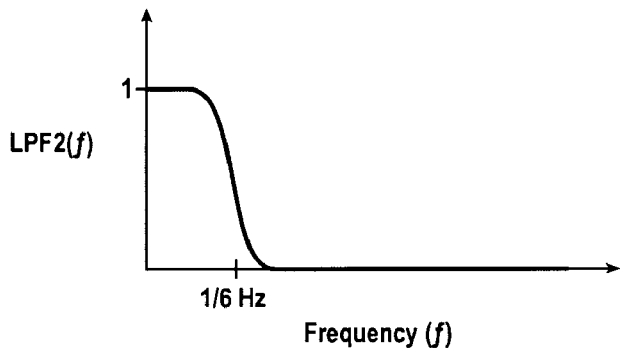

According to the present invention, the log [e(t)] at the output of LOG block 32 is connected to the high pass filter 78 and the low pass filter 80. The implementation of the low pass filter 80 may be made with a simple first order low pass filter characteristic having a corner at ⅙ Hz, embodiments of which are well known to those of ordinary skill in the art. The high pass filter 78 may be implemented with the understanding that the first order high pass filter transfer function is the low pass filter function subtracted from 1. A high pass filter 78 implemented in this manner is depicted in FIG. 6, and is well known to those of ordinary skill in the art. The transfer functions for the high pass filter 78 and the low pass filter 80 are illustrated in FIGS. 7A and 7B, respectively. It will be appreciated that filter orders and cut off frequencies other than those recited herein may be selected as a matter of design choice according to the present invention.

Alternatively, the high pass filter 78 and the low pass filter 80 of FIG. 5C may be replaced with a noise estimator in a manner illustrated in FIG. 8. Various implementations of noise estimators are well known to those of ordinary skill in the art. A suitable implementation of a noise estimator is suggested in the article by Harry Teder, *Hearing Instruments in Noise and the Syllabic Speech-to-Noise Ratio*, Hearing Instruments, Vol. 42, No. 2 (1991), recited above. In this embodiment, switching artifacts are generated as the noise estimator switches between an estimate of the noise when speech is present and an estimate when the speech is absent.

Turning again to FIG. 5C, the output of the high pass filter 78 is log $[e_d(t)]$, representing the dynamic portion of the acoustic signal envelope. The output of the low pass filter 80 is log $[e_n(t)]$, representing the near stationary portion of the signal envelope. At the summing junction 82, the value log $[e_{max}]$ is subtracted from the output of the low pass filter 80 in the same manner as the value log $[e_{max}]$ was subtracted at the summing junction 76 in FIG. 5B. The dynamic portion of the logarithm of the signal which is the output from HPF2 block 78 is amplified by the gain (G−1). According to the present invention, the value log [atten] is then also added to the outputs of the amplifier blocks 84 and 86 at the summing junction 88.

The output from the summing junction 88 is input into the exponentiation block 48. The output of the exponentiation block 48 is multiplied by the value of the input signal through the delay block 74 by multiplier 72. The selection of K as described above, along with the selection of the attenuation value, atten, may be made in two or more of the multiplicative AGC circuits 20-n to provide a similar attenuation of the background noise across several of the channels. The attenuation value, atten, may be controlled by a volume control circuit in a manner as described above.

Figure 5D:
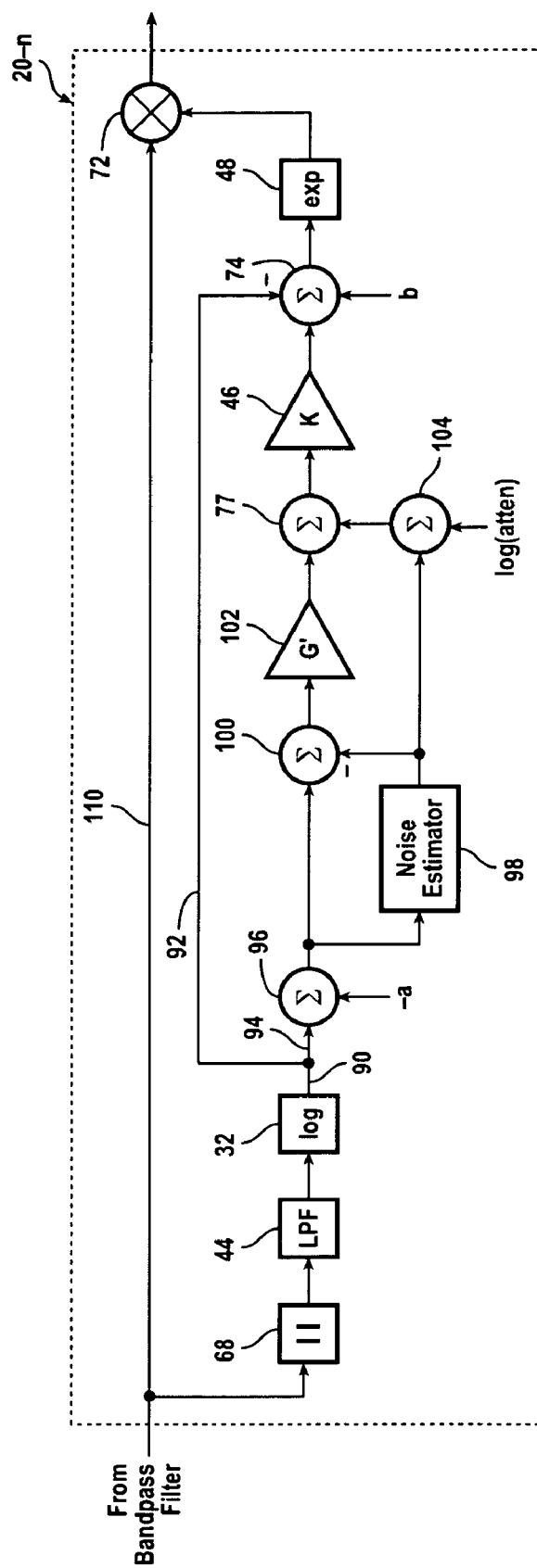
FIG. 5D is a block diagram of a third embodiment of a MAGC circuit with noise suppression in accordance with the present invention.

FIG. 5D illustrates an alternative embodiment of a noise suppression circuit in accordance with the present invention. In FIG. 5D the output of the LOG block 32 on line 90 is split into two paths 92 and 94. One output on line 94 from LOG block 32 is fed into the summing junction 96 and a quantity designated by "−a" is added (or "a" is subtracted). The value of "a" is the logarithm (to the same base as the log in block 22) of the threshold value of sound for the respective AGC band 20-n. As recited earlier, a noise estimator block 98 is used to provide an estimate of the stationary portion of the logarithm of the envelope, log $[e_n(t)]$. An estimate of the dynamic portion of the logarithm of the envelope, log $[e_d(t)]$, is obtained at the output of the summing junction 100 by adding the output of the summing junction 96 to the negative of the output of the noise estimator block 98. This output from summing junction 100 is then multiplied in amplifier 102 by a gain G' which is $$G' = 1 - \frac{X \log(atten)}{|\log[e_d(t)]| - Y \cdot \log(atten)}$$

where $$Y = \frac{k}{k(K_{max} - 1) + \log(atten)}$$

and $$X = K_{max} \cdot Y$$

The choice of an adaptive gain G' is obtained from three specifications: (1) the maximum gain Kmax which corresponds to the gain to restore a maximum desired speech level to a comfortable listening level; (2) the amount of desired attenuation, atten; and (3) the value of k=log $[e_d(t)]$ for which unity gain is desired.

Still referring to FIG. 5D, the output of the noise estimator block 98 is also combined with the value log [atten] at summing junction 104. The outputs of this summing junction 104 and the amplifier 102 are summed in summing junction 106 and the subsequent output is multiplied by K amplifier in block 46. The output from LOG block 32 on path 92 is then subtracted from the output of the amplifier 46 and then summed at summing junction 108 with the logarithm of the threshold for the user, "b". The output of summing junction 108 is then applied to an input to EXP Block 48 and an output of EXP Block 48 is then multiplied at multiplier 72 with the original signal on line 110.

Figure 5E:
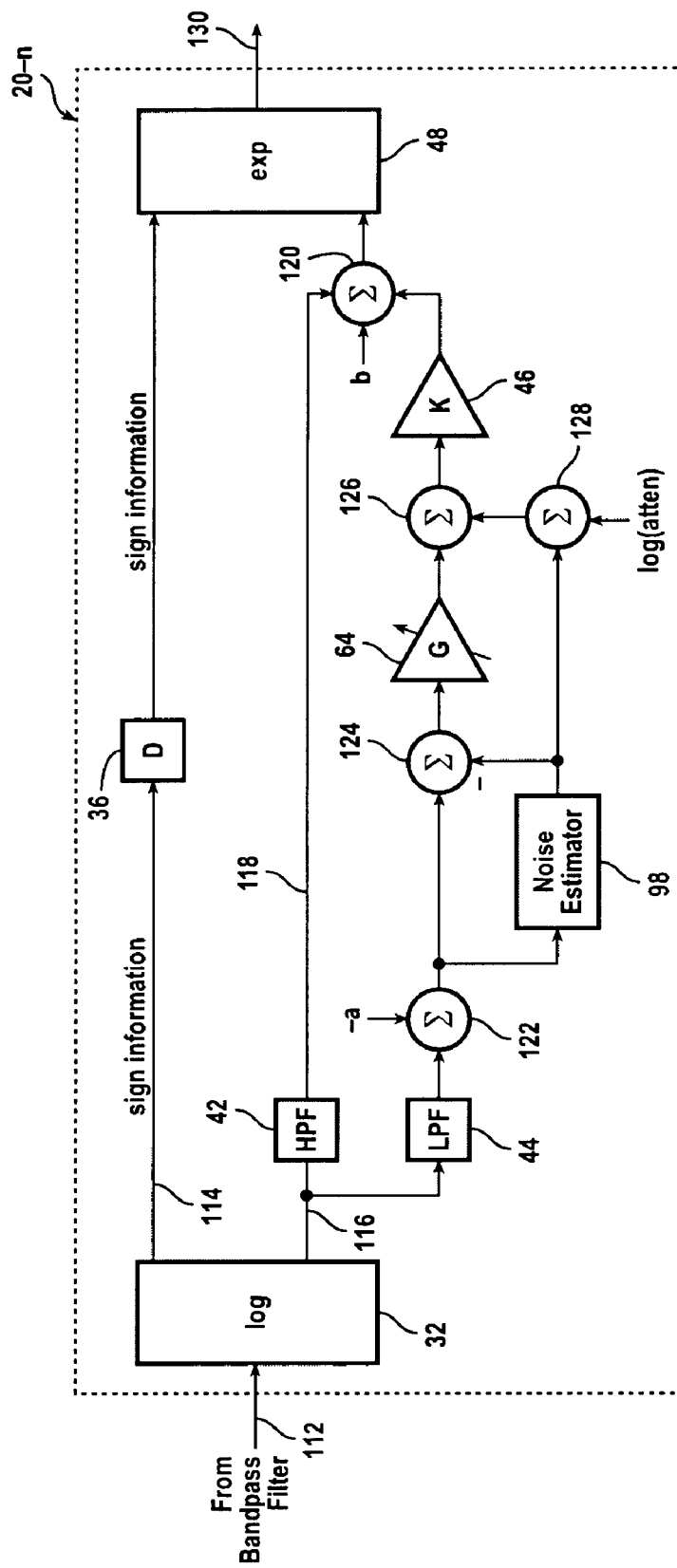
FIG. 5E is a block diagram of a fourth embodiment of a MAGC circuit with noise suppression in accordance with the present invention.

FIG. 5E illustrates another embodiment of noise reduction according to the present invention. In the FIG. 5E embodiment, input on line 112 from the bandpass filter 18-n is input to LOG block 32. Sign information is output on first output line 114 and the log information is output on second output line 116 and thence to HPF block 42 and LPF block 44. The sign information on line 114 is delayed at delay block 36 before being applied to EXP block 48 as described above. An output of LPF block 44 is applied to summing junction 122 along with the value "−a" discussed before. The output of summing junction 122 is applied to Noise Estimator 98 and to summing junction 124 as shown. The output of Noise Estimator 98 is subtractively applied to summary junction 124 along with the output of summing junction 122 and the result is them applied to adjustable gain G amplifier 64. Its output is then applied to summing junction 126 as is the output of summing junction 128 (noise estimator 98 output and log (atten)) which is applied, in turn, to K gain amplifier 46 the output of which is applied to summing junction 120 along with "b" and an output of HPF block 42 on line 18. The output of this operation is then applied to an input of EXP block 48 to provide an output on line 130.

While the MAGC circuits 20-n shown in FIGS. 2A-2C and FIGS. 5A-5C are implemented differently, it has been determined that the output resulting from either the log-lowpass implementation of FIGS. 2A-2C and the output resulting from the lowpass-log implementation of FIGS. 5A-5C are substantially equivalent, and the output of one cannot be said to be more desirable than the other. In fact, it is thought that the outputs are sufficiently similar to consider the output of either a good representation for both. Listening results of tests performed for speech data to determine if the equivalency of the log-lowpass and the lowpass-log was appropriate for the human auditory MAGC configurations indicate the intelligibility and fidelity in both configurations was nearly indistinguishable.

Although intelligibility and fidelity are equivalent in both configurations, analysis of the output levels during calibration of the system for specific sinusoidal tones revealed that the lowpass-log maintained calibration while the log-lowpass system deviated slightly from calibration. While either configuration would appear to give equivalent listening results, calibration issues favor the low-pass log implementation of FIGS. 5A-5C.

The multi-band MAGC adaptive compression approach of the present invention has no explicit feedback or feed forward. With the addition of a modified soft-limiter to the MAGC circuit 20-n, a stable transient response and a low noise floor are ensured. Such an embodiment of a MAGC circuit for use in the present invention is shown in FIG. 9A.

Figure 9A:
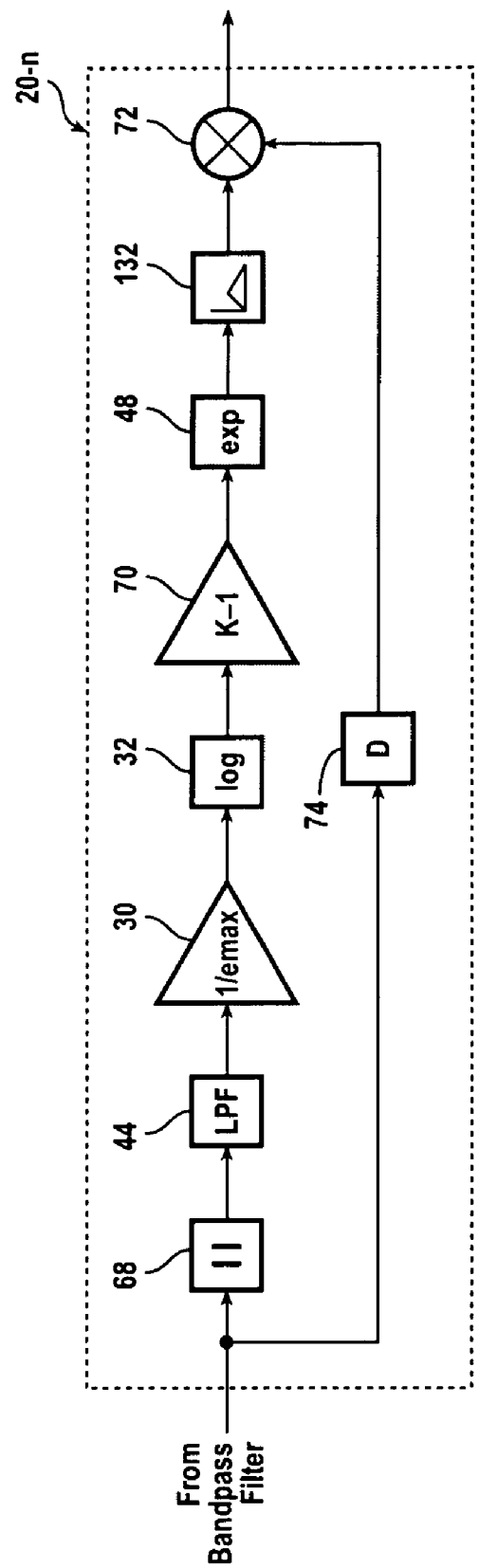
FIG. 9A is a block diagram of a third embodiment of a MAGC circuit suitable for use in accordance with the present invention.

The embodiment of FIG. 9A is similar to the embodiment shown in FIG. 5A, except that, instead of feeding the absolute value circuit 68, amplifier 30 follows the low-pass filter 44. In addition, a modified soft limiter 132 is interposed between EXP block 48 and multiplier 72. In an analog implementation, soft limiter 132 may be designed, for example, as in A. S. Sedra and K. C. Smith, *Microelectronic Circuits*, Holt, Rinehart and Winston Publishing Co., 2nd ed. (1987) (see especially pp. 230-239) with the slope in the saturation regions asymptotic to zero. The output of soft limiter block 132 is the gain of the system. The insertion of the soft limiter block 132 in the circuit of FIG. 9A limits the gain to the maximum value which is set to be the gain required to compensate for the hearing loss at threshold.

In a digital implementation, soft limiter 132 may be realized as a subroutine which provides an output to multiplier 72 equal to the input to soft limiter 132 for all values of input less than the value of the gain to be realized by multiplier 72 required to compensate for the hearing loss at threshold and provides an output to multiplier 72 equal to the value of the gain required to compensate for the hearing loss at threshold for all inputs greater than this value. Those of ordinary skill in the art will now recognize that multiplier 72 functions as a variable gain amplifier whose gain is limited by the output of soft limiter 132. It is further convenient, but not necessary, to modify the soft limiter 132 to limit the gain for soft sounds below threshold to be equal to or less than that required for hearing compensation at threshold. If the soft limiter 132 is so modified, then care must be taken to ensure that the gain below the threshold of hearing is not discontinuous with respect to a small change in input level.

Use of the modified soft limiter 132 provides another beneficial effect by eliminating transient overshoot in the system response to an acoustic stimulus which rapidly makes the transition from silence to an uncomfortably loud intensity. The stabilization effect of the soft limiter 132 may also be achieved by introducing appropriate delay into the system, but this can have damaging side effects. Excessive delayed speech transmission to the ear of one's own voice causes a feedback delay which can induce stuttering. Use of the modified soft limiter 132 eliminates the acoustic delay used by other techniques and simultaneously provides stability and an enhanced signal-to-noise ratio.

Figure 9B:
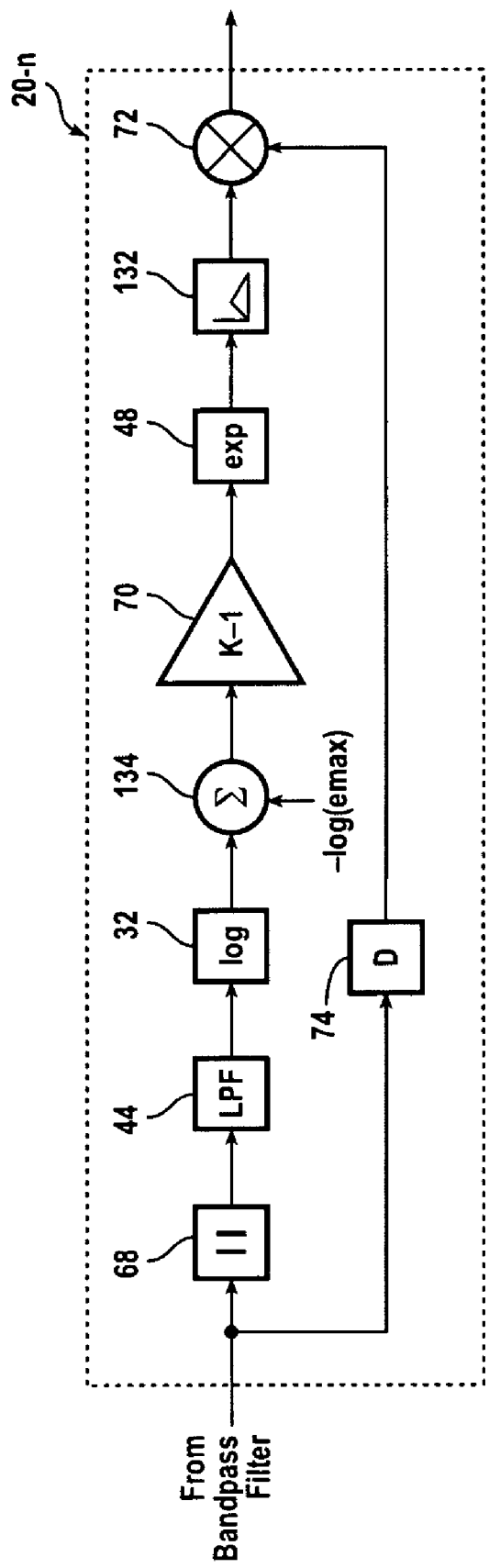
FIG. 9B is a block diagram of an alternative embodiment of the MAGC circuit shown in FIG. 9A suitable for use in accordance with the present invention.

FIG. 9B is a block diagram of a variation of the circuit shown in FIG. 9A. Those of ordinary skill in the art will now recognize that amplifier 30 may be eliminated and its gain function may be realized equivalently by subtracting the value log $[e_{max}]$ from the output of LOG block 32 in summing circuit 134 as shown in FIG. 9B without deviating from the concepts herein.

Figure 10:
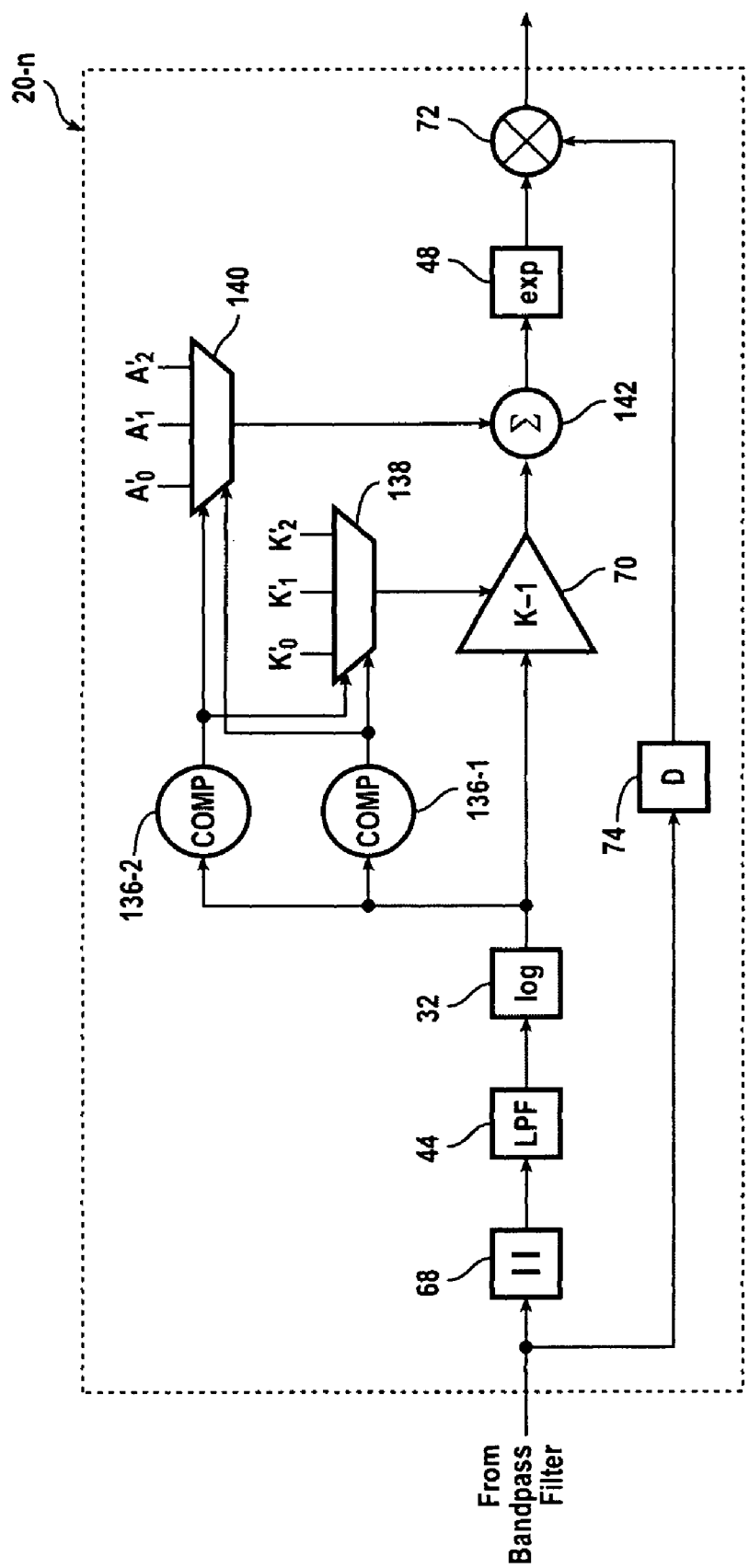
FIG. 10 is a block diagram of an embodiment of a MAGC circuit in accordance with the present invention.
Figure 11:
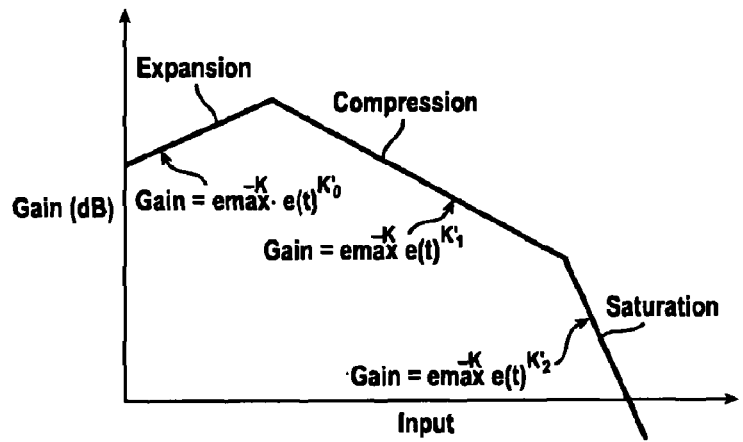
FIG. 11 is a graph illustrating the three slope gain regions of the MAGC circuit of FIG. 10 in accordance with the present invention.

Turning now to FIG. 10, an embodiment of multiplicative AGC circuit 20-*n* implementing a three slope gain curve according to the present invention is illustrated. In FIG. 10, the output of the LOG block 32 is connected to first and second comparator circuits 136-1 and 136-2. The comparator circuits compare the output of LOG block 32 with predetermined input levels to determine which of the three gain regions illustrated in the graph shown at FIG. 11 is to be applied. The outputs of first and second comparator circuits are connected to the first and second select inputs of gain multiplexer 138 and normalization multiplexer 140. The first, second and third inputs, $K_0'$, $K_1'$, and $K_2'$ to gain multiplexer 138 provide the value of (K−1) in the amplifier 70.

The first, second and third inputs, $A_0'$, $A_1'$, and $A_2'$ to normalization multiplexer 140 provide the normalization implemented by the amplifier 30 in FIGS. 2A, 5A, and 9A by adding the value (K−1) log $[e_{max}]$ to the output of amplifier 70 by summing node 142. Since the normalization occurs after the operation of amplifier 70, it should be appreciated that the value of K is included in each of the three inputs to the normalization multiplexer 140. Further, the value of K included in each of the three inputs corresponds to the value of K that is employed by amplifier 70 in response to the output from gain multiplexer 138.

According to this embodiment of the present invention, comparator circuits 136-1 and 136-2 divide the amplitude of the output from LOG block 32 into expansion, compression and saturation regions. An exemplary graph of the gain provided to the input in the three regions is illustrated in FIG. 11. The upper limit of the expansion region is set by the threshold hearing loss determined during a fitting of the hearing aid on the user. When the amplitude of the output from LOG block 32 is below the threshold hearing loss, the inputs $K_0'$ and $A_0'$ will be selected, and the gain of the amplifier 70 will preferably provide expansive gain to the input. For input signal energy at low levels constituting unwanted noise, expansion is useful by reducing the gain to those low level signals.

The lower limit of the compression region is set by the threshold hearing loss, and the upper limit is set by compression provided to the signal in the compression region and the compression provided in the saturation region. When the amplitude of the output from LOG block 32 is above the threshold hearing loss, and below the upper limit of the compression region, the inputs $K_1'$ and $A_1'$ will be selected, and the gain of the amplifier 70 will preferably provide compressive gain to the input. The compression provided in each channel will be determined during the fitting of the hearing aid.

When the amplitude of the output from LOG block 32 is above the upper limit of the compression region, the inputs $K_2'$ and $A_2'$ will be selected, and the gain of the amplifier 70 will preferably provide compressive gain to the input. The compression in the saturation region will typically be greater than the compression in the compression region. In the saturation region, the output is limited to a level below the maximum output capability of the output transducer. This is preferred to other types of output limiting, such as peak clipping.

An alternate method for achieving stability is to add a low level (i.e., with an intensity below the hearing threshold level) of noise to the inputs to the audio bandpass filters 18-1 through 18-*n*. This noise should be weighted such that its spectral shape follows the threshold-of-hearing curve for a normal hearing individual as a function of frequency. This is shown schematically by the noise generator NG (144) in FIG. 1. Noise generator 144 is shown injecting a low level of noise into each of audio bandpass filters 18-1 through 18-*n*. Numerous circuits and methods for noise generation are well known in the art and need not be further described here.

In the embodiments of FIGS. 5A-5D, FIGS. 9A and 9B, and FIG. 10, the subcircuit comprising absolute value circuit 68 followed by low-pass filter 44 functions as an envelope detector. The absolute value circuit 68 may function as a half-wave rectifier, a full-wave rectifier, or a circuit whose output is the RMS value of the input with an appropriate scaling adjustment. Because the output of this envelope detector subcircuit has a relatively low bandwidth, the envelope updates in digital realizations of this circuit need only be performed at the Nyquist rate for the envelope bandwidth, a rate less than 500 Hz. Those of ordinary skill in the art will now appreciate that this will enable low power digital implementations.

The MAGC full range adaptive compression for hearing compensation differs from the earlier FFT work in several significant ways. The multi-band multiplicative AGC adaptive compression technique of the present invention does not employ frequency domain processing but instead uses time domain filters with similar or equivalent Q based upon the required critical bandwidth. In addition, in contrast to the FFT approach, the system of the present invention employing multiplicative AGC adaptive compression may be implemented with a minimum of delay and no explicit feedforward or feedback.

In the prior art FFT implementation, the parameter to be measured using this prior art technique was identified in the phon space. The presently preferred system of the present invention incorporating multi-band MAGC adaptive compression inherently includes recruitment, and requires only the measure of threshold hearing loss and upper comfort level as a function of frequency in the embodiments illustrated in FIGS. 2A-2C, FIGS. 5A-5E, and FIGS. 9A and 9B.

Finally, the multi-band MAGC adaptive compression technique of the present invention utilizes a modified soft limiter 132 or alternatively a low level noise generator 144 which eliminates the additive noise artifact introduced by prior-art processing and maintains sound fidelity. However, more importantly, the prior-art FFT approach will become unstable during the transition from silence to loud sounds if an appropriate time delay is not used. The MAGC embodiments of the present invention are stable with a minimum of delay.

The multi-band, MAGC adaptive compression approach of the present invention has several advantages. For the embodiments described with respect to FIGS. 2A-2C, FIG. 5A-5E and FIGS. 9A and 9B, only the threshold and upper comfort levels for the person being fitted need to be measured. The same lowpass filter design is used to extract the envelope, e(t), of the sound stimulus s(t), or equivalently the log [e(t)], for each of the frequency bands being processed. Further, by using this same filter design and simply changing the cutoff frequencies of the low-pass filters as previously explained, other applications may be accommodated including those where rapid transition from silence to loud sounds is anticipated.

The multi-band, MAGC adaptive compression approach of the present invention has a minimum time delay. This eliminates the auditory confusion which results when an individual speaks and hears his or her own voice as a direct path response to the brain and receives a processed delayed echo through the hearing aid system.

Normalization with the factor $e_{max}$, makes it mathematically impossible for the hearing aid to provide a gain which raises the output level above a predetermined upper comfort level, thereby protecting the ear against damage from excessive sound intensity. For sound input levels greater than $e_{max}$ the device attenuates sound rather than amplifying it. Those of ordinary skill in the art will now recognize that further ear protection may be obtained by limiting the output to a maximum safe level without departing from the concepts herein.

A separate exponential constant K is used for each frequency band which provides precisely the correct gain for all input intensity levels, hence, no switching between linear and compression ranges occurs. Thus, switching artifacts are eliminated.

The multi-band, MAGC adaptive compression approach of the present invention has no explicit feedback or feedforward. With the addition of a modified soft limiter, stable transient response and a low noise floor are ensured. A significant additional benefit over the prior art which accrues to the present invention as a result of the minimum delay and lack of explicit feedforward or feedback in the multiplicative AGC is the amelioration of annoying audio feedback or regeneration typical of hearing aids which have both the hearing aid microphone and speaker within close proximity to the ear.

The MAGC may be implemented with either digital or analog circuitry due to its simplicity. Low power implementation is possible. As previously noted, in digital realizations, the envelope updates (i.e., the operations indicated by amplifier 20, LOG block 22, amplifier 42) need only be performed at the Nyquist rate for the envelope bandwidth, a rate less than 500 Hz, thereby significantly reducing power requirements.

The multi-band, MAGC adaptive compression system of the present invention is also applicable to other audio problems. For example, sound equalizers typically used in stereo systems and automobile audio suites can take advantage of the multi-band MAGC approach since the only user adjustment is the desired threshold gain in each frequency band. This is equivalent in adjustment procedure to current graphic equalizers, but the MAGC provides a desired frequency boost without incurring abnormal loudness growth as occurs with current systems.

According to another aspect of the present invention, an in-the-ear hearing compensation system employs two transducers converting electrical signal-to-acoustical energy. Two recent developments have made a dual-receiver hearing aid possible. The first is the development of miniaturized moving-coil transducers and the second is the critical-band compression technology disclosed herein and also disclosed and claimed in parent U.S. patent application Ser. No. 08/272,927 filed Jul. 8, 1994, now U.S. Pat. No. 5,500,902.

Figure 12:
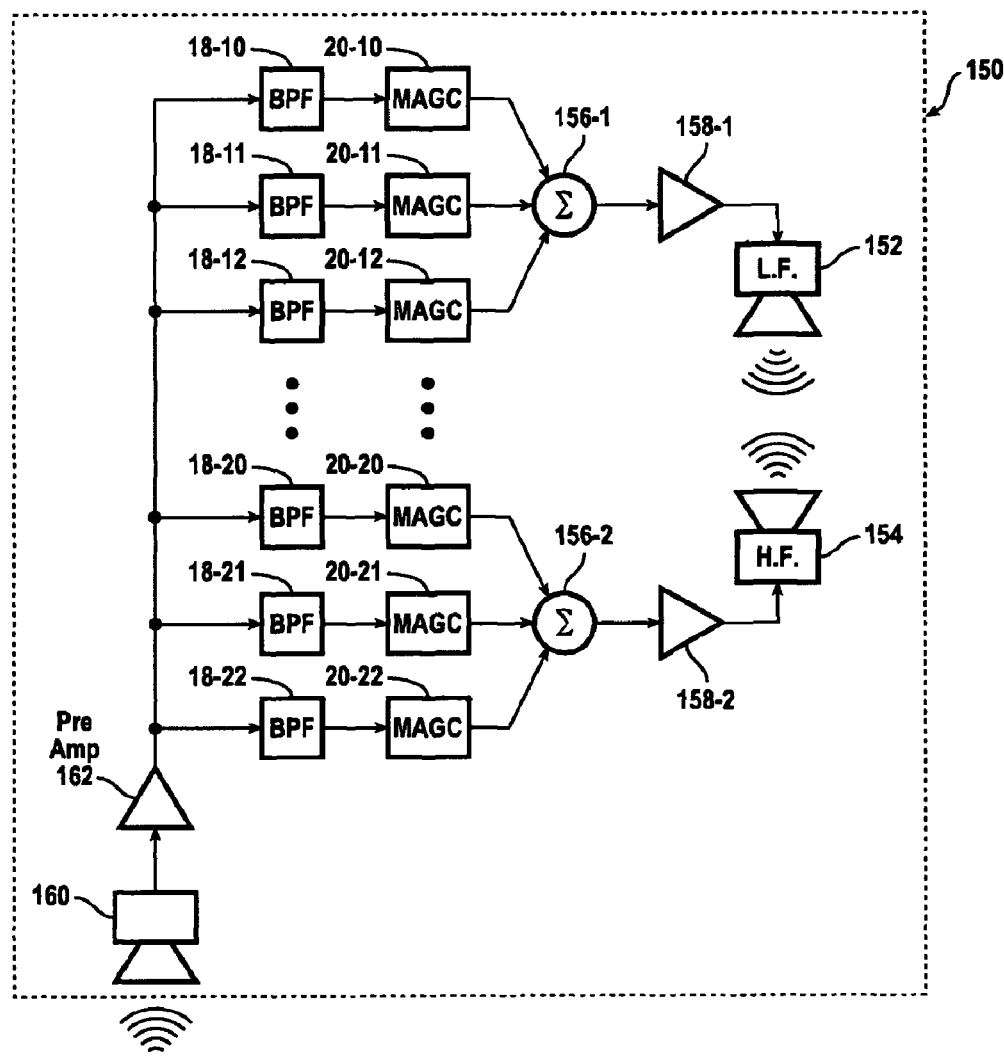
FIG. 12 is a block diagram of an in-the-ear hearing compensation system in accordance with the present invention employing two transducers converting electrical signals to acoustical energy.

Referring now to FIG. 12, a block diagram of an in-the-ear hearing compensation system 150 employing two transducers converting electrical-signal to acoustical-energy is presented. A first such transducer 152, such as a conventional iron-armature hearing-aid receiver is employed for low frequencies (e.g., below 1 kHz) and a second such transducer 154 is employed for high frequencies (e.g., above 1 kHz).

Demand for high-fidelity headphones for portable electronic devices has spurred development of moving-coil transducers less than ½ inch diameter that provide flat response over the entire audio range (20-20,000 Hz). To fit in the ear canal, a transducer must be less than ¼ inch in diameter, and therefore the commercially available transducers are not presently applicable. A scaling of the commercial moving-coil headphone to 3/16 in diameter yields a transducer that has excellent efficiency from 1 kHz to well beyond the upper frequency limit of human hearing. The system of the present invention uses such a scaled moving-coil transducer 154 as the tweeter, and a standard Knowles (or similar) iron-armature hearing-aid transducer 152 as the woofer. Both of these devices together can easily be fit into the ear canal.

The hearing compensation system shown in FIG. 12 is conceptually identical to the parent invention except that the processing channels, each containing a bandpass filter and multiplicative AGC gain control, are divided into two groups. The first group, comprising bandpass filters 18-10, 18-11, and 18-12 and MAGC circuits 20-10, 20-11, and 20-12, processes signals with frequencies below the resonance of the iron-armature transducer 152. The second group, comprising bandpass filters 18-20, 18-21, and 18-22 and MAGC circuits 20-20, 20-21, and 20-22 processes signals above the resonance of the iron-armature transducer 154. The outputs of the first group of processing channels are summed in summing element 156-1, and fed to power amplifier 158-1, which drives iron-armature transducer 152. The outputs of the second group of processing channels are summed in summing element 156-2, and fed to power amplifier 158-2, which drives high-frequency moving-coil transducer 154. The inputs to both processing channels are supplied by electret microphone 160 and preamplifier 162.

Using the arrangement shown in FIG. 12 where the frequency separation into high and low components is accomplished using the bandpass filters, no crossover network is needed, thereby simplifying the entire system. Persons of ordinary skill in the art will now appreciate that processing and amplifying elements in the first group may be specialized for the frequency band over which they operate, as can those of the second group. This specialization can save considerable power dissipation in practice. Examples of such specialization include using power amplifiers whose designs are optimized for the particular transducer, using sampling rates appropriate for the bandwidth of each group, and other well-known design optimizations.

An alternative to a miniature moving-coil transducer for high-frequency transducer 154 has also been successfully demonstrated by the inventors. Modern electrets have a high enough static polarization to make their electromechanical transduction efficiency high enough to be useful as high-frequency output transducers. Such transducers have long been used in ultrasonic applications, but have not been applied in hearing compensation applications. When these electret devices are used as the high-frequency transducer 154, persons of ordinary skill in the art will now appreciate that the design specializations noted above should be followed, with particular emphasis on the power amplifier, which must be specialized to supply considerably higher voltage than that required by a moving-coil transducer.

The present invention is, of course, useable in a wide array of contexts other than in a device for the hearing impaired. For example, consumer electronic devices used in noisy environments may advantageously make use of the inventive aspects hereof. Such consumer electronics devices (referred to as audio output device in the claims) include, for example, cellular telephones, wireless telephones, wireless headsets, wired headsets, audio playback devices such as CD players, MP3 players, cassette and micro cassette players and recorders, digital tapeless audio recorders, walkie-talkies, car stereos and the like.

On occasion when an individual is listening to the audio output of such a consumer electronic device the ambient acoustical noise interferes with the individual's ability to hear and/or understand the audio output. In this context, the noisy signal includes ambient acoustical noise combined with an acoustical signal (such as a speaker or ear phone) sourced from a relatively noise-free electronic source. To ameliorate this situation, a MAGC system coupled to a set of bandpass filters may be used to amplify soft sounds to a level greater than the ambient acoustical noise background while simultaneously preserving the amplitude of the louder sounds. In order to provide the necessary boost to the soft sounds, the gain applied to the soft sounds may be adjusted manually by the individual as desired or it can be measured using a microphone and ambient noise measurement circuitry.

In this manner, compression of the audio dynamic range is provided so that the audio output intensity level of the loudest sounds are maintained (or even reduced) while the audio output intensity level of the softest sounds are amplified. This is accomplished by adjusting the gain levels for soft sounds to provide an output just above measured ambient noise levels while maintaining the audio output at the loudest levels to be below the upper comfort listening level.

While those of ordinary skill in the art will now appreciate that there are many ways to monitor the ambient noise level using one or more noise monitoring microphones, in one embodiment of the present invention a single such microphone is used.

Turning now to FIGS. 13-18, FIG. 13 is a block diagram of a system for compensating for measured ambient acoustical noise to improve the ability of a user to hear an audio signal sourced from an electronic device providing an audio output or a signal convertible to an audio output such as a consumer electronics device in a noisy environment.

Figure 13:
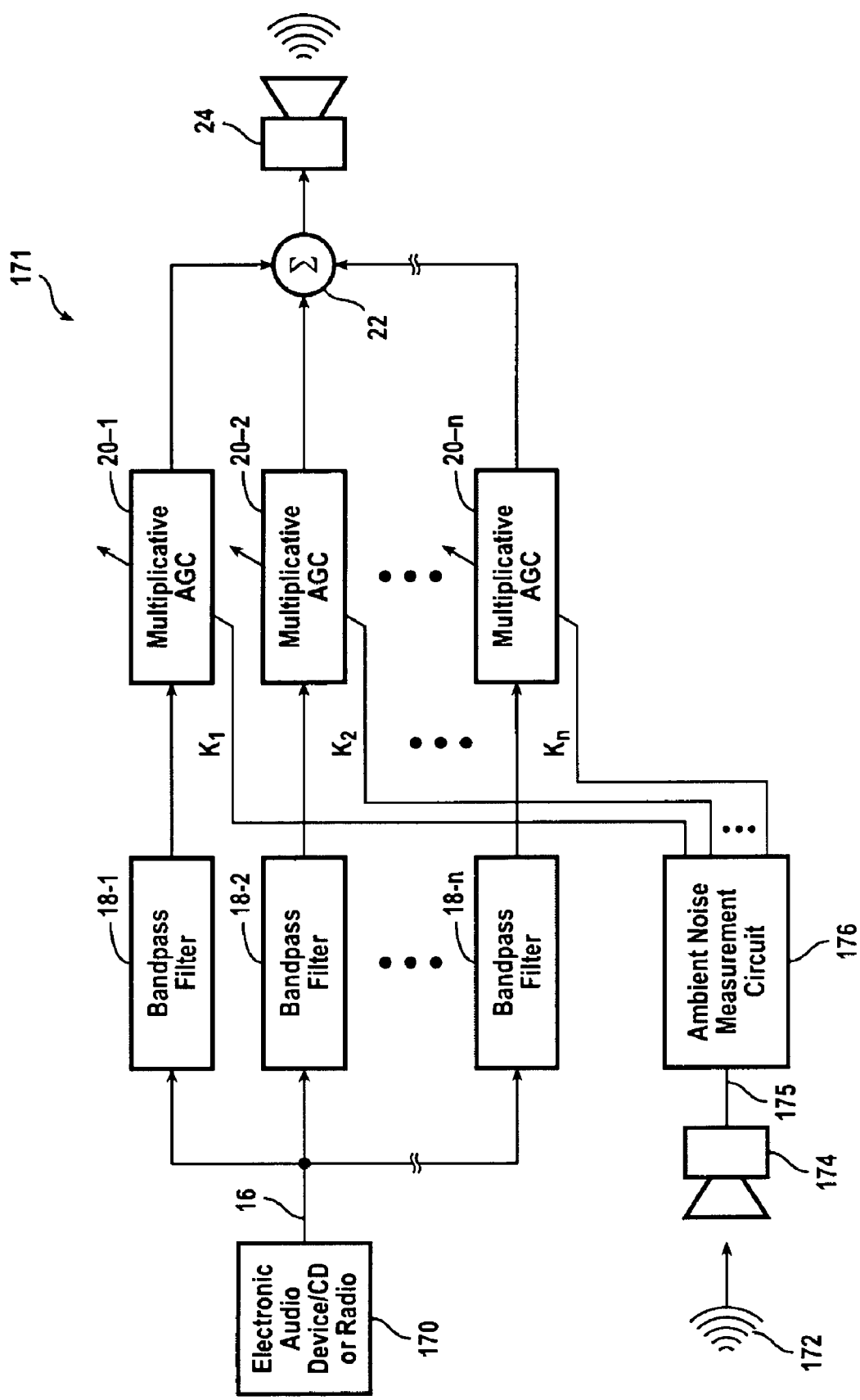
FIG. 13 is a block diagram of a system for compensating for measured ambient acoustical noise to improve the ability of a non-hearing impaired user to hear an audio signal sourced from an electronic device in a noisy environment.

In accordance with the embodiment of the present invention illustrated at FIG. 13, a consumer electronic device 170 provides on line 16 an electronic signal representative of an original audio signal (relatively noise free) on line 16 which is sent to a noise processing circuit 171 comprising a number of bandpass filters 18-1, . . . , 18-$n$ as described above. Outputs of these bandpass filters are input to MAGC circuits 20-1, . . . , 20-$n$ in accordance with any of the MAGC circuit embodiments discussed herein. The outputs of the MAGC circuits are combined at summing junction 22 and output to a transducer 24 as in FIG. 1. In this embodiment, ambient acoustical noise 172 is sensed by one (or more) microphone/acoustical sensors 174, converted to an ambient noise electrical signal on line 175 and processed by ambient noise measurement circuit 176 which acts to provide n "$K_n$" values to the MAGC circuits 20-1 through 20-$n$ to allow the system to act to improve the individual's listening experience.

Figure 14:
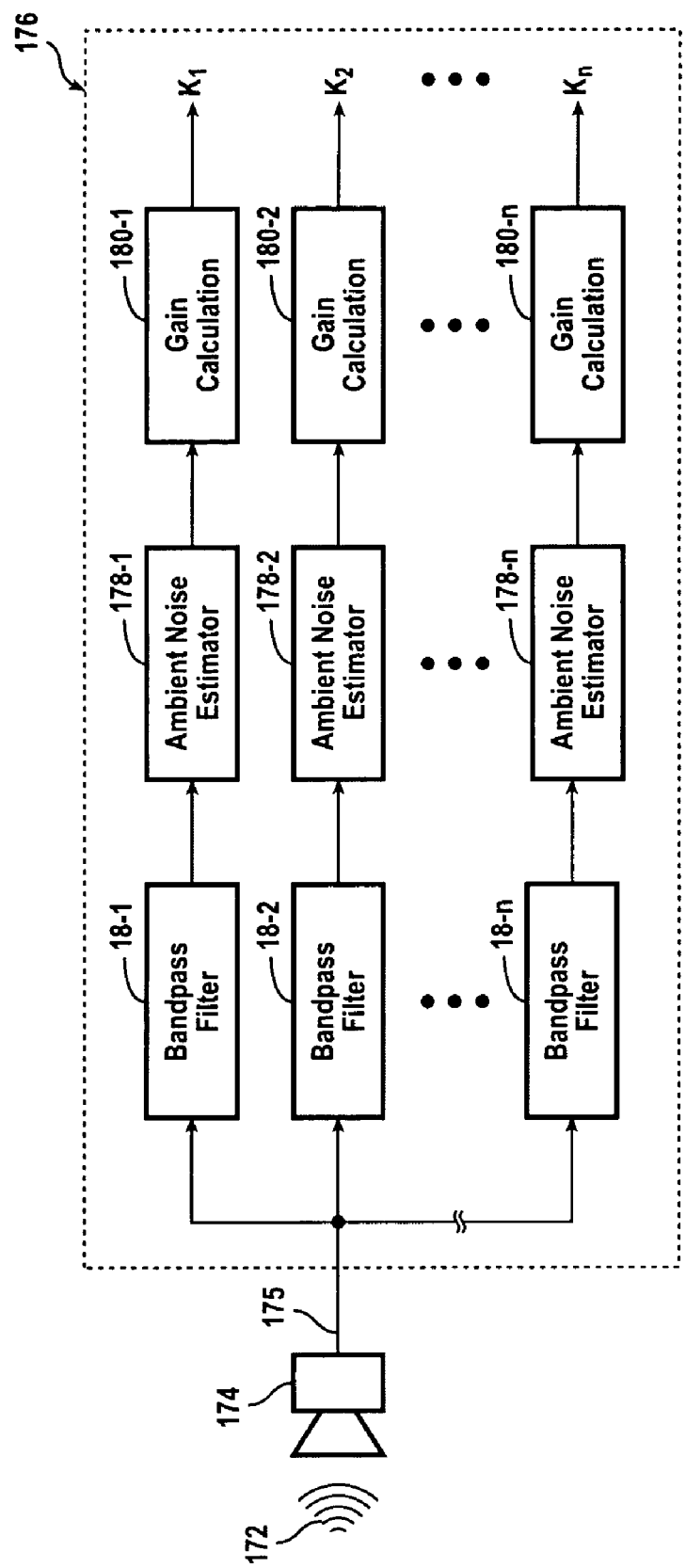
FIG. 14 is a block diagram of an exemplar of an ambient noise measurement circuit useable in conjunction with the system of FIG. 13.

Turning now to FIG. 14, an exemplary circuit for implementing the ambient noise measurement circuit 176 is illustrated in block diagram form. Noise measurement circuit 176 is divided into a plurality, n, of sections or channels. Each section of circuit 176 comprises a bandpass filter 18-$n$ (which may be but are not required to be one of the bandpass filters 18-$n$ used elsewhere in the overall noise processing circuit 171). Outputs of the bandpass filters 18-$n$ are applied to Ambient Noise Estimator circuits 178-$n$ and from there to gain calculation blocks 180-$n$ from which the values $K_n$ are supplied for use in the multiplicative automatic gain control MAGC circuits 20-$n$.

Figure 15:
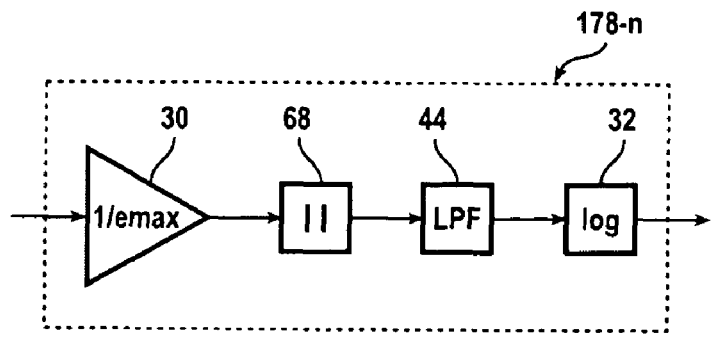
FIG. 15 is a block diagram of an exemplar of an ambient noise estimator useable in conjunction with the ambient noise measurement circuit of FIG. 14.
Figure 16:
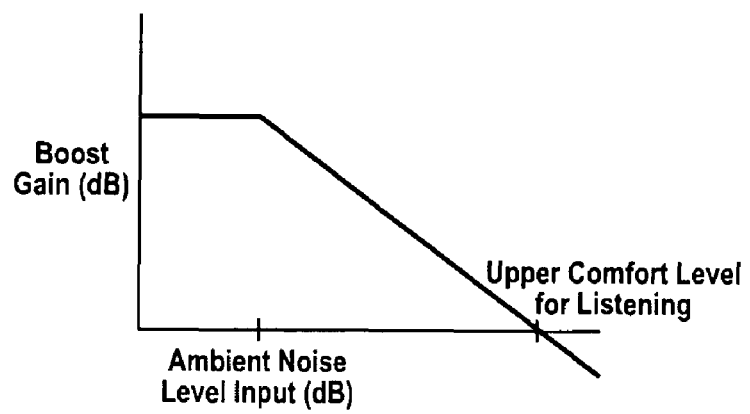
FIG. 16 is a graph of gain vs. input level for an embodiment of a noise compensation system that provides attenuation for signals above the upper comfort level for listening.
Figure 17:
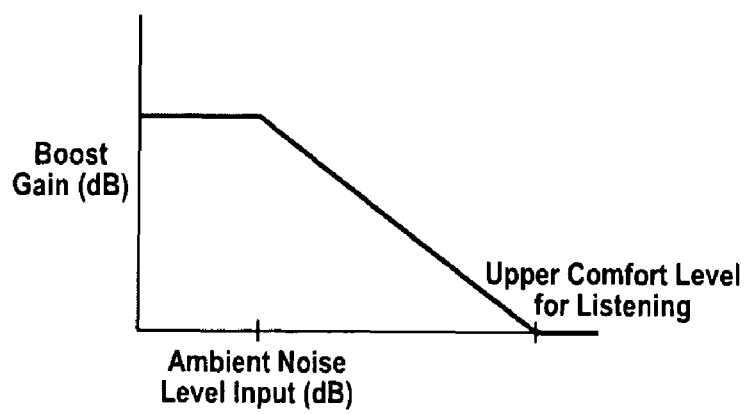
FIG. 17 is a graph of gain vs. input level for an embodiment of a noise compensation system that provides no gain for signals above the upper comfort level for listening.

FIG. 15 is an example of an ambient noise estimator circuit 178-$n$ which operates much like the noise estimator circuits discussed above in the discussion relating to FIG. 5A. Variants similar to those discussed above may be used as well. Ambient Noise Estimator Circuit 178-$n$ acts as a filter to measure the ambient noise level in each of the bandpass filter outputs. The circuit in FIG. 15 provides the appropriate values for K in each of the corresponding bands or channels of the plurality of MAGC circuits. The gain of the MAGC is adjusted in blocks 180-$n$ according to the curves in FIG. 16 or 17. To achieve the gain curves in FIG. 16, the values for $K_n$ (noting that there is a different K in each frequency channel or band) in FIGS. 2A, 2B, 5A, 5B are calculated as $$K=[1-(BOOST/(UCL-BNL)]$$

where BOOST is set to be equal to the difference between the ambient background noise level (measured in dB) and the normal hearing threshold, thereby providing a boost in dB such that the softest sounds that are normally audible only in a quiet environment are presented at a listening level equal to the ambient background sound level; UCL is the upper comfort level (measured in dB) and is normally set at or near 90 dB, though other values may be used without departing from the teachings of this invention; and BNL is the background noise level (measured in dB).

Figure 18:
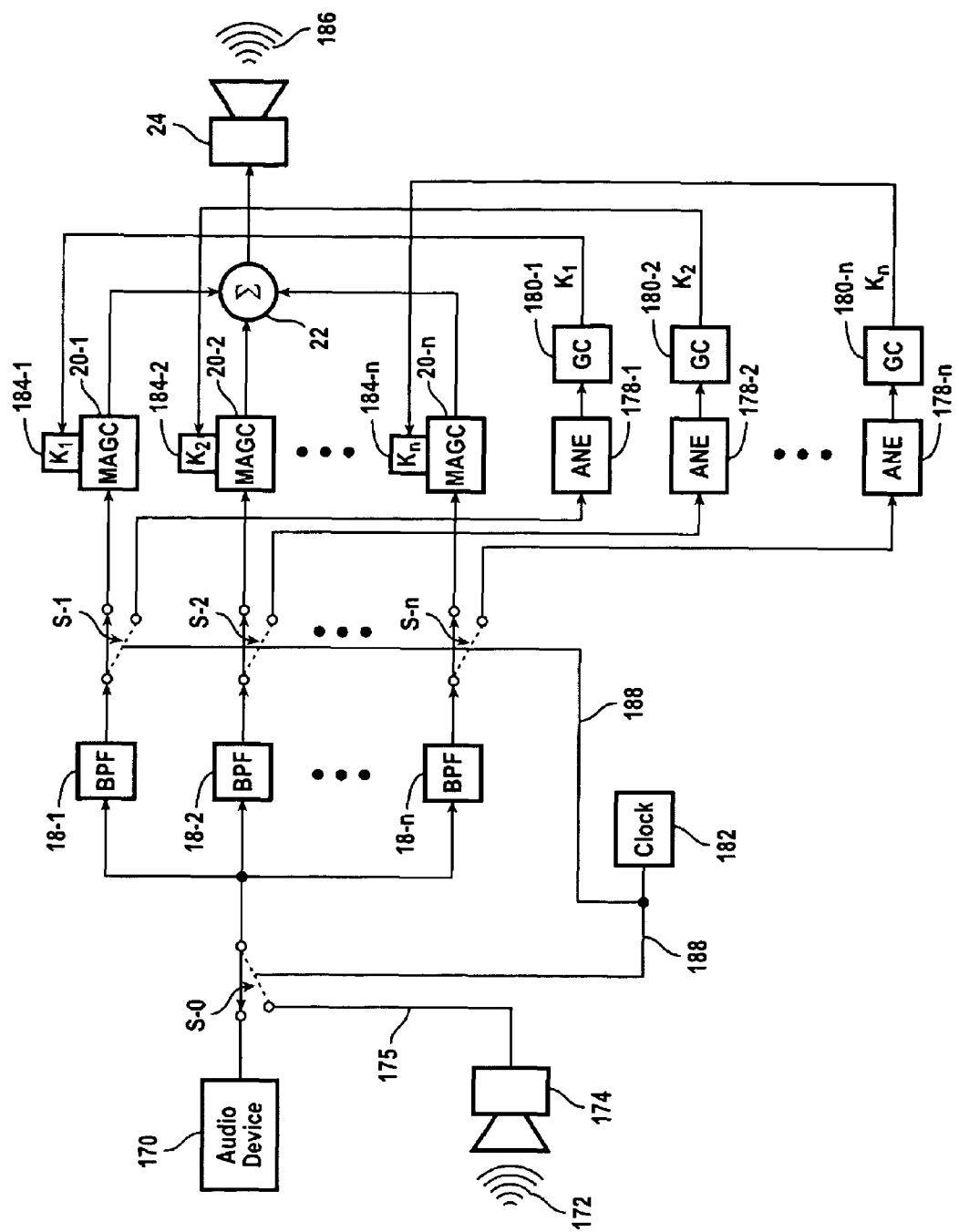
FIG. 18 is an electrical schematic diagram in block diagram form for a noise compensation system in accordance with an embodiment of the present invention.

FIG. 18 is an electrical schematic diagram in block diagram form for a noise compensation system in accordance with another embodiment of the present invention. In the circuit of FIG. 18 an alternative to the embodiment of FIG. 13 is provided in which the same physical set of bandpass filters 18-$n$ may be used both for bandpass filtering the signals applied to the MAGC circuits 20-$n$ as well as for bandpass filtering the signals applied to the Ambient Noise Estimator circuits 178-$n$ and Gain Calculator circuits 180-$n$. In accordance with this embodiment switches S0, S1, S2, . . . , Sn are supplied and controlled by block circuit 182. Block circuit 182 outputs a timing signal on line 188 to control switches S0, S1, S2, ..., Sn. When the clock is in a first phase, the switches are in a first position coupling the audio device 170 to the bandpass filters 18-$n$ and the bandpass filters 18-$n$ to the MAGC circuits 20-$n$.

When the clock is in a second phase the switches couple the bandpass filters 18-$n$ to microphone transducer 174 over line 175 so that ambient acoustical noise converted to an ambient noise electrical signal is applied to the bandpass filters 18-$n$ and the outputs of the bandpass filter 18-$n$ are applied to corresponding ones of the ambient noise estimator (ANE) circuits 178-$n$ and then to Gain Calculator (GC) circuits 180-$n$ for calculation of the values $K_n$. The $K_n$ values are then applied to a memory or buffer circuit 184-$n$ for use by the corresponding MAGC circuits 20-$n$. These values of $K_n$ are held until a different value is applied at the next clock cycle.

In this manner the bandpass filters can be used for double duty, if desirable in a particular application, for example, for reasons relating to cost, size, and the like. Note that the switches Sn may be of any suitable type such as transistors, relays, diodes and the like. The memory/buffer circuits 184-$n$ may be any suitable form of digital memories for digital information storage in digital circuits or analog memories (e.g., capacitors) for analog circuits. The ultimate noise-compensated output 186 comes from output transducer 24.

Such circuits as are taught herein are useable in electronic devices such as consumer electronic devices where the source program material may be virtually noise free but the act of listening may take place in a noisy environment such as a car or a crowded room. In such situation these circuits will boost the softer sounds and leave unchanged (or possibly attenuate) the louder sounds to improve comprehension.

While embodiments and applications of this invention have been shown and described, it will now be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An audio output device, comprising:
an acoustic input transducer for converting input acoustical energy into output electrical signals corresponding to the input acoustical energy;
a plurality of audio bandpass filters coupled to receive said electrical signals, each of said audio bandpass filters having an output; and
a plurality of multiplicative automatic gain control (MAGC) circuits coupled to a respective output of one of said plurality of audio bandpass filters, at least one of said MAGC circuits including a hearing compensation circuit and a noise suppression circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
wherein an acoustic signal having approximately a constant amplitude for a period of a predetermined amount of time is attenuated through interaction of said hearing compensation circuit and said noise suppression circuit.

2. The device of claim 1, further comprising:
an acoustic output transducer responsive to said plurality of MAGC circuits.

3. The device of claim 1, wherein said noise suppression circuit comprises a bandpass filter.

4. The audio output device of claim 3, wherein said bandpass filter is configured to have a single pole at a minimum frequency and a single zero at a cutoff frequency.

5. The audio output device of claim 1, wherein:
said hearing compensation circuit comprises a high pass filter and a low pass filter;
an output of said low pass filter is coupled to an amplifier having amplifier constant K and having an amplifier output; and
said amplifier output and an output of said hearing compensation circuit are summed together.

6. An audio output device, comprising:
an input transducer for converting input acoustical energy into output electrical energy corresponding to the input acoustical energy;
a plurality of audio bandpass filters coupled to the output of said input transducer;
a plurality of multiplicative automatic gain control (MAGC) circuits, each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to said plurality of MAGC circuits,
wherein noise present in the acoustical energy is attenuated through interaction of said hearing compensation circuit and said noise estimation circuit.

7. The audio output device of claim 6, wherein an acoustic signal having an approximately constant amplitude for a period of a predetermined amount of time is attenuated through interaction of said hearing compensation circuit and said noise estimation circuit.

8. An audio output device, comprising,
an input transducer for converting input acoustical energy into output electrical signals corresponding to the input acoustical energy;
a plurality of audio bandpass filters coupled to the output of said input transducer;
a plurality of multiplicative automatic gain control (MAGC) circuits, each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and a subtraction circuit to subtract the estimate of noise from the logarithm of the input envelope amplitude;

an output transducer responsive to said plurality of MAGC circuits, wherein an acoustic signal having approximately a constant amplitude for a period of a predetermined amount of time is attenuated through interaction of said hearing compensation circuit and said noise estimation circuit.

9. A hearing aid device, comprising:

an input transducer for converting input acoustical energy into output electrical signals corresponding to the input acoustical energy;

a plurality of audio bandpass filters coupled to receive said output electrical signals, each of said audio bandpass filters having an output;

a plurality of multiplicative automatic gain control (MAGC) circuits, each of said MAGC circuits coupled to an output of one of said plurality of audio bandpass filters, at least one of said MAGC circuits including a hearing compensation circuit and a noise suppression circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;

an output transducer responsive to said plurality of multiplicative automatic gain control (AGC) circuits, wherein an acoustic signal having approximately a constant amplitude for a period of a predetermined amount of time is attenuated through interaction of said hearing compensation circuit and said noise suppression circuit.

10. The hearing aid device of claim 9, wherein said noise suppression circuit comprises a bandpass filter.

11. The hearing aid device of claim 10, wherein said bandpass filter is configured to have a single pole at a minimum frequency and a single zero at a cutoff frequency.

12. The hearing aid device of claim 9, wherein:

said hearing compensation circuit comprises a high pass filter and a low pass filter;

an output of said low pass filter is coupled to an amplifier having amplifier constant K and having an amplifier output; and said amplifier output and an output of said hearing compensation circuit are summed together.

13. A hearing aid device, comprising:

an input transducer for converting input acoustical energy into output electrical energy corresponding to the input acoustical energy;

a plurality of audio bandpass filters coupled to the output of said input transducer;

a plurality of multiplicative automatic gain control (MAGC) circuits, each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;

an output transducer responsive to said plurality of MAGC circuits, wherein noise present in the acoustical energy is attenuated through interaction of said hearing compensation circuit and said noise estimation circuit.

14. The hearing aid device of claim 13, wherein an acoustic signal having an approximately constant amplitude for a period of a predetermined amount of time is attenuated through interaction of said hearing compensation circuit and said noise estimation circuit.

15. A hearing aid output device, comprising, an input transducer for converting input acoustical energy into output electrical signals corresponding to the input acoustical energy;

a plurality of hearing aid bandpass filters coupled to the output of said input transducer;

a plurality of multiplicative automatic gain control (MAGC) circuits, each of said MAGC circuits coupled to an output of one of said hearing aid bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;

an output transducer responsive to said plurality of MAGC circuits, wherein an acoustic signal having approximately a constant amplitude for a period of a predetermined amount of time is attenuated through interaction of said hearing compensation circuit and said noise estimation circuit.

16. An audio output device, comprising:

an input transducer for converting input acoustical energy into output electrical signals corresponding to the input acoustical energy;

a multiplicative automatic gain control (MAGC) circuit coupled to said input transducer, said MAGC circuit including a high pass filter having an output, a low pass filter having an output, the output of said low pass filter being amplified by a factor of K, and a noise suppression circuit having an output; and an output transducer responsive to said plurality of MAGC circuits, wherein the amplified output of said low pass filter and the output of the noise suppression circuit are linearly combined to produce a first signal, the output of said high pass filter is linearly combined with the first signal; and an acoustic signal having approximately a constant amplitude for a period of a predetermined amount of time is attenuated through interaction of said high pass filter, said low pass filter and said noise suppression circuit.

17. The audio output device of claim 16, wherein said noise suppression circuit comprises a bandpass filter.

18. The audio output device of claim 17, wherein said bandpass filter is configured to have a single pole at a minimum frequency and a single zero at a cutoff frequency.

19. An audio output device, comprising:
an input transducer for converting input acoustical energy into output electrical signals corresponding to the input acoustical energy;
a plurality of audio bandpass filters coupled to receive said electrical signals, each of said audio bandpass filters having an output;
a plurality of multiplicative automatic gain control (MAGC) circuits each having at least one input and at least one output, an input of each of said MAGC circuits coupled to an output of one of said plurality of audio bandpass filters, at least one of said MAGC circuits comprising a hearing compensation circuit and a noise suppression circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to said outputs of said plurality of MAGC circuits;
wherein an acoustic signal having approximately a constant amplitude for a period of a predetermined amount of time is attenuated through interaction of said hearing compensation circuit and said noise suppression circuit.

20. The audio output device of claim 19, wherein:
said hearing compensation circuit comprises a high pass filter and a low pass filter;
an output of said low pass filter is coupled to an amplifier having amplifier constant K and having an amplifier output; and
said amplifier output and an output of said hearing compensation circuit are summed together.

21. The audio output device of claim 19 wherein the electrical signals are attenuated and added to said outputs of the MAGC circuits.

22. The audio output device of claim 19, wherein the MAGC circuits have the ability to provide one gain function for noise and another gain function for desired signals.

23. The audio output device of claim 19, wherein the MAGC circuits may utilize a selected one of the gain functions of: expansion, compression, and saturation.

24. The audio output device of claim 19, wherein the MAGC circuits may utilize selected ones of the gain functions of expansion, compression, and saturation.

25. The audio output device of claim 19, wherein the MAGC circuits provide a maximum limit to the gain.

26. The audio output device of claim 25, wherein the maximum amount of attenuation is set to an amount that results in a minimum gain and the MAGC circuits provide a maximum limit to gain.

27. The audio output device of claim 19, wherein the bandpass filter is implemented with bandpass filters having increasing bandwidth as the center frequency of the bandpass filter increases.

28. The audio output device of claim 19, wherein the bandpass filters are implemented so that all the bandpass filters have the same bandwidth.

29. An audio output device, comprising:
an input transducer for converting input acoustical energy into output electrical energy corresponding to the input acoustical energy;
a plurality of audio bandpass filters coupled to the output of said input transducer;
a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to said plurality of MAGC circuits,
wherein noise present in the acoustical energy is attenuated through interaction of said hearing compensation circuit and said noise estimation circuit.

30. The audio output device of claim 29, wherein an acoustic signal having approximately a constant amplitude for a period of a predetermined amount of time is attenuated through interaction of said hearing compensation circuit and said noise estimation circuit.

31. An audio output device, comprising:
an input transducer for converting input acoustical energy into output electrical signals corresponding to the input acoustical energy;
a plurality of audio bandpass filters coupled to the output of said input transducer;
a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to said plurality of multiplicative MAGC circuits,
wherein an acoustic signal having approximately a constant amplitude for a period of a predetermined amount of time is attenuated through interaction of said hearing compensation circuit and said noise estimation circuit.

32. A hearing aid device comprising:
an input transducer for converting input acoustical energy into output electrical signals corresponding to the input acoustical energy;
a plurality of audio bandpass filters coupled to receive said electrical signals, each of said audio bandpass filters having an output;
a plurality of multiplicative automatic gain control (MAGC) circuits each having at least one input and at least one output, an input of each of said MAGC circuits coupled to an output of one of said plurality of audio bandpass filters, at least one of said MAGC circuits including a hearing compensation circuit and a noise suppression circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to said outputs of said plurality of (MAGC) circuits;
wherein an acoustic signal having approximately a constant amplitude for a period of a predetermined amount of time is attenuated through interaction of said hearing compensation circuit and said noise suppression circuit.

33. The hearing aid device of claim 32, wherein:
said hearing compensation circuit comprises a high pass filter and a low pass filter;
an output of said low pass filter is coupled to an amplifier having an amplifier gain of K and having an amplifier output; and
said amplifier output and an output of said hearing compensation circuit are summed together.

34. The hearing aid device of claim 32, wherein the electrical signals are attenuated and added to said outputs of the MAGC circuits.

35. The hearing aid device for claim 32, wherein the MAGC circuits have the ability to provide one gain function for noise and another gain function for desired signals.

36. The hearing aid device of claim 32, wherein the MAGC circuits may utilize a selected one of the gain functions of: expansion, compression, and saturation.

37. The hearing aid device of claim 32, wherein the MAGC circuits may utilize selected ones of the gain functions of expansion, compression, and saturation.

38. The hearing aid device of claim 32, wherein the bandpass filter is implemented with bandpass filters having increasing bandwidth as the center frequency of the bandpass filter increases.

39. The hearing aid device of claim 32, wherein the bandpass filters are implemented so that all the bandpass filters have the same bandwidth.

40. A hearing aid device comprising:
an input transducer for converting input acoustical energy into output electrical energy corresponding to the input acoustical energy;
a plurality of audio bandpass filters coupled to the output of said input transducer;
a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to output of said plurality of MAGC circuits,
wherein noise present in the acoustical energy is attenuated through interaction of said hearing compensation circuit and said noise estimation circuit.

41. The hearing aid device of claim 40, wherein an acoustic signal having approximately a constant amplitude for a period of a predetermined amount of time is attenuated through interaction of said hearing compensation circuit and said noise estimation circuit.

42. The hearing aid device of claim 40, wherein the MAGC circuits provide a maximum limit to the gain.

43. A hearing aid device comprising:
an input transducer for converting input acoustical energy into output electrical signals corresponding to the input acoustical energy;
a plurality of audio bandpass filters coupled to the output of said input transducer;
a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and
a subtraction circuit to subtract the estimate of noise from the logarithm of the input envelope amplitude;
an output transducer responsive to said plurality of MAGC circuits,
wherein an acoustic signal having approximately a constant amplitude for a period of a predetermined amount of time is attenuated through interaction of said hearing compensation circuit and said noise estimation circuit.

44. An audio output device, comprising:
an input transducer for converting input acoustical energy into output electrical signals corresponding to the input acoustical energy;
a plurality of audio bandpass filters coupled to receive said electrical signals, each of said audio bandpass filters having an output;
a plurality of multiplicative automatic gain control (MAGC) circuits, each having at least one input and at least one output, an input of each of said MAGC circuits coupled to an output of one of said plurality of audio bandpass filters, at least one of said MAGC circuits including a hearing compensation circuit and a noise suppression circuit, and wherein at least one of said MAGC circuits include:
a first circuit to obtain an input envelope amplitude from the coupled audio bandpass filter output;
a second circuit responsive to the input envelope amplitude to provide a logarithm of the input envelope amplitude;
a noise estimation circuit for obtaining an estimate of noise; and a subtraction circuit to subtract the estimate of noise from the logarithm of the input envelope amplitude;

an output transducer responsive to said plurality of MAGC circuits, wherein an acoustic signal having approximately a constant amplitude for a period of a predetermined amount of time is attenuated through interaction of said hearing compensation circuit and said noise suppression circuit.

45. The audio output device of claim 44, wherein:

said hearing compensation circuit comprises a high pass filter and a low pass filter;

an output of said low pass filter is coupled to an amplifier having an amplifier gain of K and having an amplifier output; and said amplifier output and an output of said hearing compensation circuit are summed together.

46. An audio output device comprising:

an input transducer for converting input acoustical energy into output electrical energy corresponding to the input acoustical energy;

a plurality of audio bandpass filters coupled to the output of said input transducer;

a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:

a first circuit to obtain an input envelope amplitude from the coupled audio bandpass filter output;

a second circuit responsive to the input envelope amplitude to provide a logarithm of the input envelope amplitude;

a noise estimation circuit for obtaining an estimate of noise; and a subtraction circuit to subtract the estimate of noise from the logarithm of the input envelope amplitude;

an output transducer responsive to said plurality of MAGC circuits, wherein noise present in the acoustical energy is attenuated through interaction of said hearing compensation circuit and said noise estimation circuit.

47. The audio output device of claim 46, wherein an acoustic signal having approximately a constant amplitude for a period of a predetermined amount of time is attenuated through interaction of said hearing compensation circuit and said noise estimation circuit.

48. The audio output device of claim 46, wherein the maximum amount of attenuation is set to an amount that results in a minimum gain and the MAGC circuits provide a maximum limit to gain.

49. An audio output device comprising:

an input transducer for converting input acoustical energy into output electrical signals corresponding to the input acoustical energy;

a plurality of audio bandpass filters coupled to the output of said input transducer;

a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:

a first circuit to obtain an input envelope amplitude from the coupled audio bandpass filter output;

a second circuit responsive to the input envelope amplitude to provide a logarithm of the input envelope amplitude;

a noise estimation circuit for obtaining an estimate of noise; and a subtraction circuit to subtract the estimate of noise from the logarithm of the input envelope amplitude;

an output transducer responsive to said plurality of MAGC circuits, wherein an acoustic signal having approximately a constant amplitude for a period of a predetermined amount of time is attenuated through interaction of said hearing compensation circuit and said noise estimation circuit.

50. The audio output device of claim 49 wherein the electrical signals are attenuated and added to said outputs of the MAGC circuits.

51. The audio output device of claim 49, wherein the MAGC circuits have the ability to provide one gain function for noise and another gain function for desired signals.

52. The audio output device of claim 49, wherein the MAGC circuits may utilize a selected one of the gain functions of: expansion, compression, and saturation.

53. The audio output device of claim 49, wherein the MAGC circuits may utilize selected ones of the gain functions of: expansion, compression, and saturation.

54. The audio output device of claim 49, wherein the MAGC circuits provide a maximum limit to the gain.

55. The audio output device of claim 49, wherein the bandpass filter is implemented with bandpass filters having increasing bandwidth as the center frequency of the bandpass filter increases.

56. The audio output device of claim 49, wherein the bandpass filters are implemented so that all the bandpass filters have the same bandwidth.

57. A hearing aid device, comprising:

an input transducer for converting input acoustical energy into output electrical signals corresponding to the input acoustical energy;

a plurality of audio bandpass filters coupled to receive said electrical signals, each of said audio bandpass filters having an output;

a plurality of multiplicative automatic gain control (MAGC) circuits, each having at least one input and at least one output, an input of each of said MAGC circuits coupled to an output of one of said plurality of audio bandpass filters, at least one of said MAGC circuits including a hearing compensation circuit and a noise suppression circuit, and wherein at least one of said MAGC circuits include:

a first circuit to obtain an input envelope amplitude from the coupled audio bandpass filter output;

a second circuit responsive to the input envelope amplitude to provide a logarithm of the input envelope amplitude;

a noise estimation circuit for obtaining an estimate of noise; and a subtraction circuit to subtract the estimate of noise from the logarithm of the input envelope amplitude;

an output transducer responsive to said plurality of MAGC circuits, wherein an acoustic signal having approximately a constant amplitude for a period of a predetermined amount of time is attenuated through interaction of said hearing compensation circuit and said noise suppression circuit.

58. The hearing aid device of claim 57, wherein:
said hearing compensation circuit comprises a high pass filter and a low pass filter;
an output of said low pass filter is coupled to an amplifier having an amplifier gain of K and having an amplifier output; and
said amplifier output and an output of said hearing compensation circuit are summed together.

59. An hearing aid device comprising:
an input transducer for converting input acoustical energy into output electrical energy corresponding to the input acoustical energy;
a plurality of audio bandpass filters coupled to the output of said input transducer;
  a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:
  a first circuit to obtain an input envelope amplitude from the coupled audio bandpass filter output;
  a second circuit responsive to the input envelope amplitude to provide a logarithm of the input envelope amplitude;
  a noise estimation circuit for obtaining an estimate of noise; and
  a subtraction circuit to subtract the estimate of noise from the logarithm of the input envelope amplitude;
an output transducer responsive to said plurality of MAGC circuits,
wherein noise present in the acoustical energy is attenuated through interaction of said hearing compensation circuit and said noise estimation circuit.

60. The hearing aid device of claim 59, wherein an acoustic signal having approximately a constant amplitude for a period of a predetermined amount of time is attenuated through interaction of said hearing compensation circuit and said noise estimation circuit.

61. A hearing aid device, comprising:
an input transducer for converting input acoustical energy into output electrical signals corresponding to the input acoustical energy;
a plurality of audio bandpass filters coupled to the output of said input transducer;
  a plurality of multiplicative automatic gain control (MAGC) circuits, each having at least one input and at least one output, an input of each of said MAGC circuits coupled to an output of one of said audio bandpass filters, at least one of said MAGC circuits including a hearing compensation circuit and a noise estimation circuit, and wherein at least one of said MAGC circuits include:
  a first circuit to obtain an input envelope amplitude from the coupled audio bandpass filter output;
  a second circuit responsive to the input envelope amplitude to provide a logarithm of the input envelope amplitude;
  a noise estimation circuit for obtaining an estimate of noise; and
  a subtraction circuit to subtract the estimate of noise from the logarithm of the input envelope amplitude;
an output transducer responsive to said plurality of multiplicative AGC circuits,
wherein an acoustic signal having approximately a constant amplitude for a period of a predetermined amount of time is attenuated through interaction of said hearing compensation circuit and said noise estimation circuit.

62. The hearing aid device of claim 61 wherein the electrical signals are attenuated and added to said outputs of the MAGC circuits.

63. The hearing aid device of claim 61, wherein the MAGC circuits have the ability to provide one gain function for noise and another gain function for desired signals.

64. The hearing aid device of claim 61, wherein the MAGC circuits may utilize a selected one of the gain functions of: expansion, compression, and saturation.

65. The hearing aid device of claim 61, wherein the MAGC circuits may utilize selected ones of the gain functions of expansion, compression, and saturation.

66. The hearing aid device of claim 61, wherein the MAGC circuits provide a maximum limit to the gain.

67. The hearing aid device of claim 61, wherein the bandpass filter is implemented with bandpass filters having increasing bandwidth as the center frequency of the bandpass filter increases.

68. The hearing aid device of claim 61, wherein the bandpass filters are implemented so that all the bandpass filters have the same bandwidth.

* * * * *